United States Patent
Eichler et al.

(10) Patent No.: US 9,818,910 B2
(45) Date of Patent: Nov. 14, 2017

(54) OPTOELECTRONIC COMPONENT AND METHOD FOR THE PRODUCTION THEREOF

(71) Applicant: OSRAM Opto Semiconductors GmbH, Regensburg (DE)

(72) Inventors: Christoph Eichler, Donaustauf (DE); Adrian Stefan Avramescu, Regensburg (DE); Teresa Wurm, Mintraching (DE); Jelena Ristic, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/501,110

(22) PCT Filed: Aug. 4, 2015

(86) PCT No.: PCT/EP2015/067878
§ 371 (c)(1),
(2) Date: Feb. 1, 2017

(87) PCT Pub. No.: WO2016/020348
PCT Pub. Date: Feb. 11, 2016

(65) Prior Publication Data
US 2017/0222087 A1    Aug. 3, 2017

(30) Foreign Application Priority Data
Aug. 4, 2014 (DE) .......... 10 2014 111 058

(51) Int. Cl.
*H01L 33/00* (2010.01)
*H01L 33/06* (2010.01)
(Continued)

(52) U.S. Cl.
CPC ............. *H01L 33/06* (2013.01); *H01L 27/20* (2013.01); *H01L 33/025* (2013.01); *H01L 33/16* (2013.01);
(Continued)

(58) Field of Classification Search
CPC ..... H01L 33/06; H01L 29/125; H01L 25/167; H01L 33/007; H01L 51/5056
See application file for complete search history.

(56) References Cited

U.S. PATENT DOCUMENTS 6,515,308 B1 * 2/2003 Kneissl .............. H01S 5/18341
257/104
8,173,991 B2    5/2012 Stauss et al.
(Continued)

FOREIGN PATENT DOCUMENTS

DE   102007046027 A1   4/2009
EP      1560276 A2     8/2005
(Continued)

*Primary Examiner* — Thao P Le
(74) *Attorney, Agent, or Firm* — Slater Matsil, LLP

(57) ABSTRACT

An optoelectronic component and a method for the producing an optoelectronic component are disclosed. In an embodiment, the component comprises an active zone for generating electromagnetic radiation, wherein the active zone adjoins at least one layer arrangement of a semiconductor material, wherein the layer arrangement comprises at least two layers, wherein the two layers are formed in such a way that at an interface between the two layers a piezoelectric field is provided, the piezoelectric field configured to provide an electrical voltage drop at the interface, wherein a peak doping region is provided at the interface of the two layers in order to reduce the electrical voltage drop, wherein, in the direction away from the active zone, a doping of the peak doping region increases at least by a first percentage value and then decreases by at least a second percentage
(Continued)

value, and wherein the first percentage value and the second percentage value are greater than 10% of a maximum doping of the peak doping region.

20 Claims, 21 Drawing Sheets

(51) Int. Cl.
  *H01L 27/20* (2006.01)
  *H01L 33/02* (2010.01)
  *H01L 41/083* (2006.01)
  *H01L 41/08* (2006.01)
  *H01L 33/16* (2010.01)

(52) U.S. Cl.
  CPC ........ *H01L 41/083* (2013.01); *H01L 41/0805* (2013.01)

(56) References Cited

U.S. PATENT DOCUMENTS

| | | | |
|---|---|---|---|
| 8,669,585 B1 * | 3/2014 | Chen | H01L 33/06 257/101 |
| 2002/0053676 A1 | 5/2002 | Kozaki | |
| 2002/0096675 A1 * | 7/2002 | Cho | B82Y 20/00 257/25 |
| 2003/0116767 A1 * | 6/2003 | Kneissl | B82Y 20/00 257/79 |
| 2005/0067613 A1 | 3/2005 | Kim | |
| 2007/0246736 A1 * | 10/2007 | Senda | B82Y 20/00 257/103 |

FOREIGN PATENT DOCUMENTS

| | | |
|---|---|---|
| WO | 0141224 A2 | 6/2001 |
| WO | 2009085050 A1 | 7/2009 |

* cited by examiner

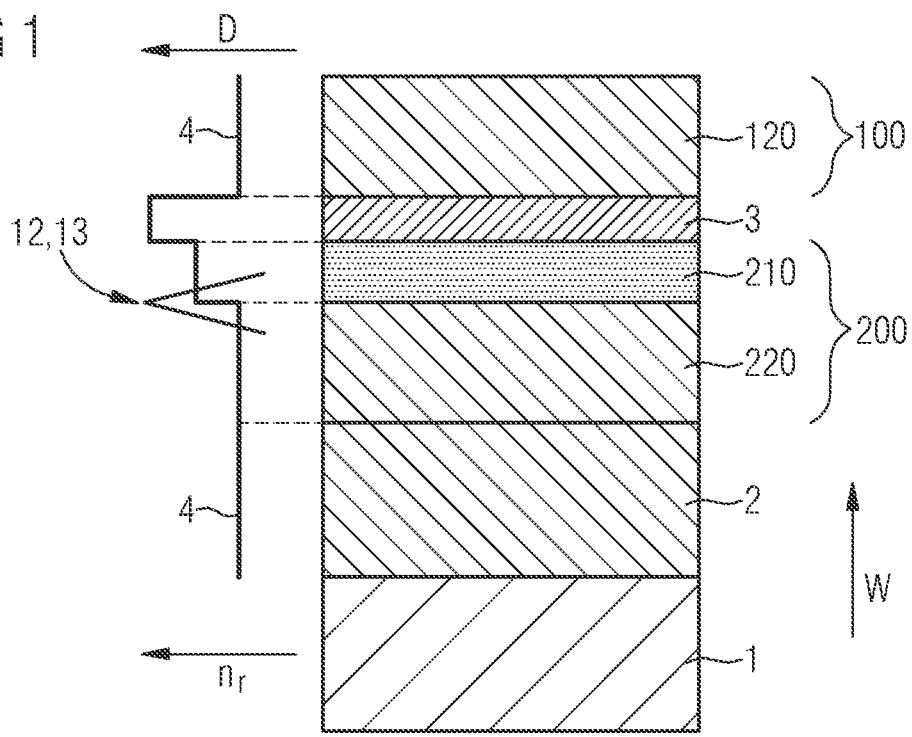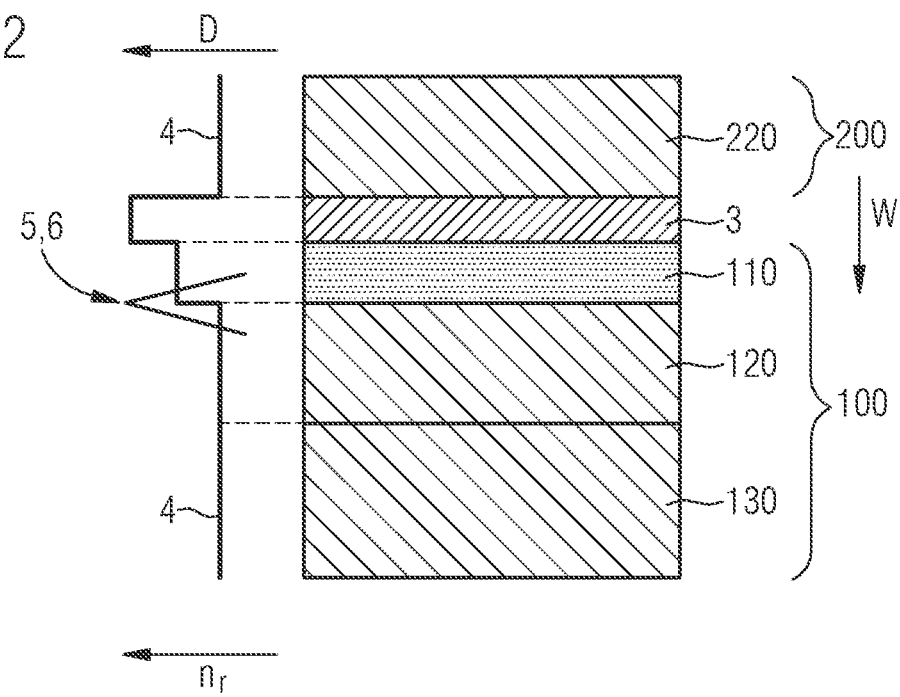

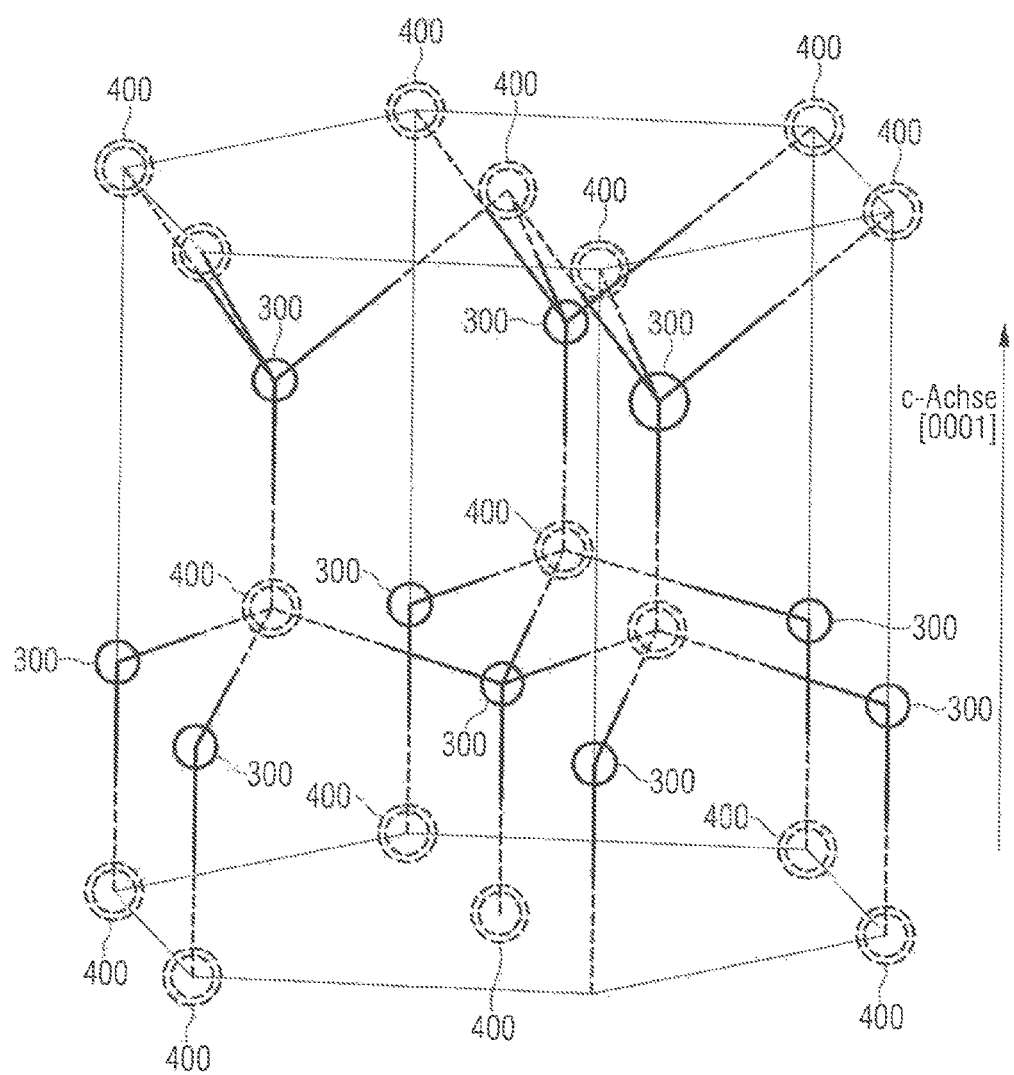

OPTOELECTRONIC COMPONENT AND METHOD FOR THE PRODUCTION THEREOF

This patent application is a national phase filing under section 371 of PCT/EP2015/67878, filed Aug. 4, 2015, which claims the priority of German patent application 10 2014 111 058.7, filed Aug. 4, 2014, each of which is incorporated herein by reference in its entirety.

TECHNICAL FIELD

The invention relates to an optoelectronic component and to a method for the production of an optoelectronic component.

BACKGROUND

The prior art discloses optoelectronic components such as semiconductor lasers, for example, which comprise an active zone for generating electromagnetic radiation. A waveguide layer and a cladding layer adjoin the active zone. The active zone is arranged between a p-doped layer arrangement and an n-doped layer arrangement. For a good electrical conductivity the layer arrangements are positively doped and negatively doped, respectively. The layer arrangements comprise, for example, semiconducting material such as, e.g., gallium nitride, aluminum gallium nitride, indium gallium nitride, zinc oxide, magnesium zinc oxide or aluminum indium gallium nitride.

SUMMARY OF THE INVENTION

Embodiments of the invention provide an improved optoelectronic component and an improved method for producing an electronic component. One advantage of the optoelectronic component described is that an absorption of the electromagnetic radiation in the waveguide layers is reduced by a low positive and/or negative doping. At the same time, the optoelectronic component comprises a low voltage drop by virtue of the fact that a peak doping region, i.e., a doping peak, is arranged at interfaces between layers comprising different band gaps for free charge carriers. In the region between the active zone and the peak doping region, a low positive or negative doping may be present; in particular, a doping may also be completely dispensed with. The low or absent doping in the waveguide layer ensures that the electromagnetic radiation in the waveguide layer is not absorbed or is scarcely absorbed by the dopant. At the same time, for a good efficiency a low voltage drop is achieved at the interfaces of the layers comprising different band gaps by means of the peak doping regions at the interfaces. The peak doping regions are chosen in such a way that a voltage drop between the different material layers is reduced.

The peak doping region in the direction away from the active zone comprises a rise in the doping by at least 10% and then after a maximum value a fall by at least 10%. The 10% is relative to the maximum value of the peak doping. Depending on the embodiment chosen, the rise may be configured to be greater than 10%, for example, greater than 50%, for example, greater than 100%. Moreover, the fall in the peak doping region may be configured to be greater than 10%, for example, greater than 50%, in particular greater than 100%. The percentage rise and/or the percentage fall in the peak doping may also be related to the value of the doping of the layer of the interface which is arranged nearer to the active zone. The efficiency of the electrical properties of the component is improved if the active zone comprises at least one quantum well layer arranged between two barrier layers. In this case, at least one barrier layer is negatively doped. The negative doping may be greater than $5 \times 10^{17}$ $1/cm^3$.

Depending on the embodiment chosen, the optoelectronic component may comprise only one layer arrangement comprising alternating material layers or two layer arrangements comprising alternating material layers. In one embodiment, the active zone adjoins at least one layer arrangement composed of a semiconducting material, wherein the layer arrangement comprises at least two layers, wherein the two layers are formed in such a way that a piezoelectric field is generated at an interface between the two layers, said piezoelectric field bringing about an electrical voltage drop at the interface, wherein a peak doping region is provided at the interface of the two layers in order to reduce the electrical voltage drop, wherein a doping of the peak doping region in a direction away from the active zone rises at least by a first percentage value and falls again by at least a second percentage value, wherein the first and second percentage values are greater than 10% of the doping of the layer which is arranged nearer to the active zone.

In one embodiment, the semiconducting material constitutes a binary, ternary and/or quaternary III-V compound semiconductor material or II-VI compound semiconductor material, wherein the semiconducting material was grown with a surface terminated with a group III element or group II element, wherein the group III element is from the group Al, In or Ga and wherein the group II element is from the group Zn, Mg or Cd, and wherein the two layers are arranged on a p-side in relation to the active zone, and wherein a transition from a smaller band gap to a larger band gap is provided between the two layers as viewed in a growth direction of the layers, and wherein the peak doping region is positively doped.

In a further embodiment, the semiconducting material constitutes a binary, ternary and/or quaternary III-V or II-VI compound semiconductor material, wherein the semiconducting material was grown with a surface terminated with a group III or group II element, wherein the group III element is from the group Al, In or Ga and wherein the group II element is from the group Zn, Mg or Cd, and wherein the two layers are arranged on a n-side in relation to the active zone, and wherein a transition from a larger band gap to a smaller band gap is provided between the two layers as viewed in a growth direction of the layers, and wherein the peak doping region is negatively doped.

In a further embodiment, the semiconducting material constitutes a binary, ternary and/or quaternary III-V or II-VI compound semiconductor material, wherein the semiconducting material was grown with a surface terminated with a group V element or group VI element, wherein the group V element is from the group N, As or Sb, wherein the group VI element is oxygen, wherein the two layers are arranged on a p-side in relation to the active zone, wherein a transition from a larger band gap to a smaller band gap is provided between the two layers as viewed in a growth direction of the layers, and wherein the peak doping region is positively doped.

In one embodiment, the semiconducting material constitutes a binary, ternary and/or quaternary III-V or II-VI compound semiconductor material, wherein the semiconducting material was grown with a surface terminated with a group V element or group VI element, wherein the group V element is from the group N, As or Sb, wherein the group VI element is oxygen, wherein the two layers are arranged on a n-side in relation to the active zone, and a transition from a smaller band gap to a larger band gap is provided between the two layers as viewed in a growth direction of the layers, and wherein the peak doping region is negatively doped.

In one embodiment, the semiconducting material comprises a II-VI compound semiconductor material, in particular zinc oxide and/or magnesium zinc oxide, or constitutes a II-VI compound material, in particular zinc oxide and/or magnesium zinc oxide. The group II elements comprise, e.g., zinc (Zn), magnesium (Mg) and cadmium (Cd). The group VI elements comprises, e.g., oxygen (O).

Moreover, depending on the embodiment chosen, also in the case of a component comprising two layer arrangements comprising alternating material layers, only in one layer arrangement it is possible to provide a correspondingly low doping in the waveguide layer or no doping in the waveguide layer and to provide a peak doping region in the transition region between the waveguide layer and the adjacent layer.

Moreover, depending on the embodiment chosen, in the case of a component comprising two layer arrangements arranged oppositely with respect to the active zone, in each layer arrangement it is possible to provide a low doping in the waveguide layer adjoining the active zone, wherein a corresponding peak doping region is provided in the transition region between the waveguide layer and the adjacent layer.

Depending on the embodiment chosen, the rise in the doping in the peak doping region may be greater than the decrease in the doping in the peak doping region. Furthermore, depending on the embodiment chosen, the doping in the waveguide layer arranged between the peak doping region and the active zone may be lower than the doping in the adjacent layer adjoining the waveguide layer oppositely with respect to the active zone. Depending on the embodiment chosen, the doping may be positive or negative.

Experiments have shown that an improvement in the optical and/or electrical properties of the optoelectronic component are achieved if the doping of the first layer arrangement is positive and the doping in the peak doping region is at least greater than $1\times10^{18}$ $1/cm^3$, in particular greater than $5\times10^{18}1/cm^3$, in particular greater than $8\times10^{18}$ $1/cm^3$, in particular greater than $1\times10^{19}$ $1/cm^3$. With the aid of these orders of magnitude, voltage drops between the waveguide layer and the adjoining layer are sufficiently reduced.

Further experiments have shown that the efficiency and the electrical properties of the optoelectronic component are improved if the first layer of the first layer arrangement comprises a positive doping, wherein the doping is greater than $5\times10^{18}$ $1/cm^3$, in particular greater than $1\times10^{19}$ $1/cm^3$.

Furthermore, experiments have shown that in the case of an optoelectronic component comprising an active zone and a waveguide layer and a further layer adjoining the latter, an improvement in the efficiency and the electrical properties of the component are achieved if the waveguide layer comprises a negative doping, wherein the doping at least in one section is less than $1\times10^{18}$ $1/cm^3$, in particular less than $6\times10^{17}$ $1/cm^3$, in particular less than $3\times10^{17}$ $1/cm^3$, wherein the section is arranged between the active zone and the peak doping region. These values are advantageous both in the configuration of a component comprising a first and a second layer arrangement and in the configuration of a component comprising only one layer arrangement, which is then negatively doped.

In a further embodiment, an improvement in the efficiency and the electrical properties of the component is achieved if the second layer, which adjoins the second waveguide layer, comprises a negative doping which is greater than $5\times10^{17}$ $1/cm^3$, in particular greater than $1\times10^{18}$ $1/cm^3$.

A further improvement in the efficiency and the electrical properties of the component is achieved if the active zone comprises at least one quantum well layer arranged between two barrier layers. In this case, at least one barrier layer is negatively doped. The negative doping may be greater than $1\times10^{18}$ $1/cm^3$, in particular greater than $2\times10^{18}$ $1/cm^3$, in particular greater than $5\times10^{18}$ $1/cm^3$.

A further improvement in the optical and/or electrical properties is achieved by providing an active zone comprising a plurality of quantum wells, wherein a barrier layer is respectively provided between the quantum wells. Moreover, a barrier layer is also arranged between the first and respectively the last quantum well and the adjoining layer. In this embodiment, at least the first barrier layer and/or the second barrier layer, proceeding from the negatively doped adjoining layer, i.e., the n-side, are/is negatively doped, and wherein the at least one following third barrier layer may be undoped.

Advantageously, only the second barrier layer, counted from the n-side, which is arranged between the first and second quantum wells, is negatively doped, in particular highly negatively doped. The efficiency of the component is improved in this way, too.

A further improvement in the efficiency and the electrical properties of the component is achieved if the first layer adjoining the first waveguide layer of the first layer arrangement comprises a positive doping which is less than $5\times10^{19}$ $1/cm^3$, in particular is less than $5\times10^{18}$ $1/cm^3$.

A further improvement in the component is achieved if the second waveguide layer of the second layer arrangement comprises a negative doping which is less than $5\times10^{18}$ $1/cm^3$, in particular is less than $1\times10^{18}$ $1/cm^3$, preferably less than $1\times10^{17}$ $1/cm^3$, and wherein the second layer adjoining the waveguide layer comprises a negative doping which is less than $5\times10^{18}$ $1/cm^3$, in particular is less than $1\times10^{18}$ $1/cm^3$, preferably less than $1\times10^{17}$ $1/cm^3$.

A further improvement in the component is achieved if, in the second layer arrangement, negative doping in the second layer rises at a predefined distance with respect to the second waveguide layer and thus at a predefined distance with respect to the peak doping region.

A further improvement in the component is achieved if, in the first layer arrangement, adjoining the first layer a further first layer is provided, wherein in a region at least adjoining a transition region between the first layer and the further first layer the positive doping in a second peak doping region in a direction away from the active zone rises at least by a first percentage value and falls again by at least a second percentage value. The first and second percentage values may be greater than 10% in each case. Consequently, the voltage drop between the first layer and the further first layer, which consist of different materials, is also reduced with the aid of the second peak doping region.

The positive doping of the first layer outside the second peak doping region and outside the first peak doping region is less than or equal to the positive doping of the further first layer outside the second peak doping region. Depending on the embodiment chosen, the positive doping of the further first layer may be greater than the positive doping of the first layer. An improvement in the conductivity is thus achieved, wherein the intensity of the electromagnetic wave is reduced in the region of the further first layer. As a result, a higher doping may not contribute to higher absorption losses of the electromagnetic wave.

In a further embodiment, in the second layer arrangement, adjoining the second layer a further second layer is provided. The second layer and the further second layer differ in the materials. In a region at least adjoining a transition region between the second layer and the further second layer, the negative doping in a second peak doping region in the direction away from the active zone is firstly increased at least by a first percentage value and then decreased again by a second percentage value. The first and second percentage values may be greater than 10%. In this way, too, the electrical conductivity of the second layer arrangement is improved by increasing the doping at a predefined distance with respect to the active zone. The distance is chosen in such a way that the absorption losses on account of the increased doping are relatively low.

In a further embodiment, the negative doping of the second layer is less than or equal to the negative doping of the further second layer, wherein the dopings are compared only outside the first and/or the second peak doping region. Moreover, the negative doping of the further second layer may be greater than the negative doping of the second layer in each case outside the first and/or the second peak doping region.

In a further embodiment, the first peak doping region and/or the second peak doping region comprise(s) a width in the direction away from the active zone which may be in the range of between 1 nm and 100 nm. Depending on the embodiment chosen, the first and second peak doping regions are at least partly arranged in the layers adjoining one another. In a further embodiment, the first peak doping region and/or the second peak doping region comprise(s) a rising ramp and/or a falling ramp.

In a further embodiment, an additional first layer adjoins the further first layer, wherein in the transition region between the further first layer and the additional first layer the positive doping rises in the direction of the additional first layer, wherein in particular the additional first layer comprises a smaller band gap than the further first layer. A further improvement in the electrical and/or optical properties of the component is achieved by this means, too.

In a further embodiment, in the first layer arrangement a blocking layer for electrons is provided, wherein the blocking layer comprises a high positive doping and/or a large band gap. Adjoining the blocking layer a peak doping region is formed. The blocking layer adjoins the active zone or is arranged is in the first waveguide layer or between a first waveguide layer and a second waveguide layer of the first layer arrangement.

In a further embodiment, the component is configured in such a way that the positive doping of the layers outside the first peak doping region and/or the second peak doping region is formed in such a way that for a predefined minimum intensity of the electromagnetic wave the doping is below a predefined maximum doping, wherein the minimum intensity of the electromagnetic wave is less than 40%, in particular less than 15%, in particular less than 3%, and wherein the maximum doping is less than $2\times10^{19}$ doping atoms/cm$^3$, in particular less than $8\times10^{18}$ doping atoms/cm$^3$, in particular less than $4\times10^{18}$ doping atoms/cm$^3$. A sufficient electrical conductivity is achieved in this way, wherein moreover the absorption of the electromagnetic wave as a result of the doping remains low.

In a further embodiment, the component is configured in such a way that the negative doping of the layers outside the at least one peak doping region is formed in such a way that for a predefined minimum intensity of the electromagnetic wave the doping is below a predefined maximum doping, wherein the minimum intensity is less than 40%, in particular less than 15%, in particular less than 5%, and wherein the maximum doping is less than $1\times10^{18}$, in particular less than $6\times10^{17}$, in particular less than $6\times10^{17}$, in particular less than $3\times10^{17}$, doping atoms/cm$^3$.

In a further embodiment, the component is configured in such a way that the first waveguide layer and the first layer and/or the second waveguide layer and the second layer consist of different materials, such that a piezoelectric polarization field occurs in the boundary region between the layers.

Depending on the embodiment chosen, the first waveguide layer and/or the second waveguide layer and the first layer and/or the second layer may comprise a material from the following group: gallium nitride, aluminum nitride, aluminum gallium nitride, indium gallium nitride, indium aluminum nitride, aluminum indium gallium nitride.

The first further layer and/or the second further layer and/or the additional first layer and/or the additional second layer comprise a material from the following group: gallium nitride, aluminum nitride, aluminum gallium nitride, indium gallium nitride, indium aluminum nitride, aluminum indium gallium nitride.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, wherein FIG. 1 shows a first embodiment of an optoelectronic component comprising an asymmetrical layer arrangement, FIG. 2 shows a further embodiment of an optoelectronic component comprising an asymmetrical layer arrangement, FIG. 23 shows a schematic illustration of a wurtzite structure.

DETAILED DESCRIPTION OF ILLUSTRATIVE EMBODIMENTS

Figure 3:
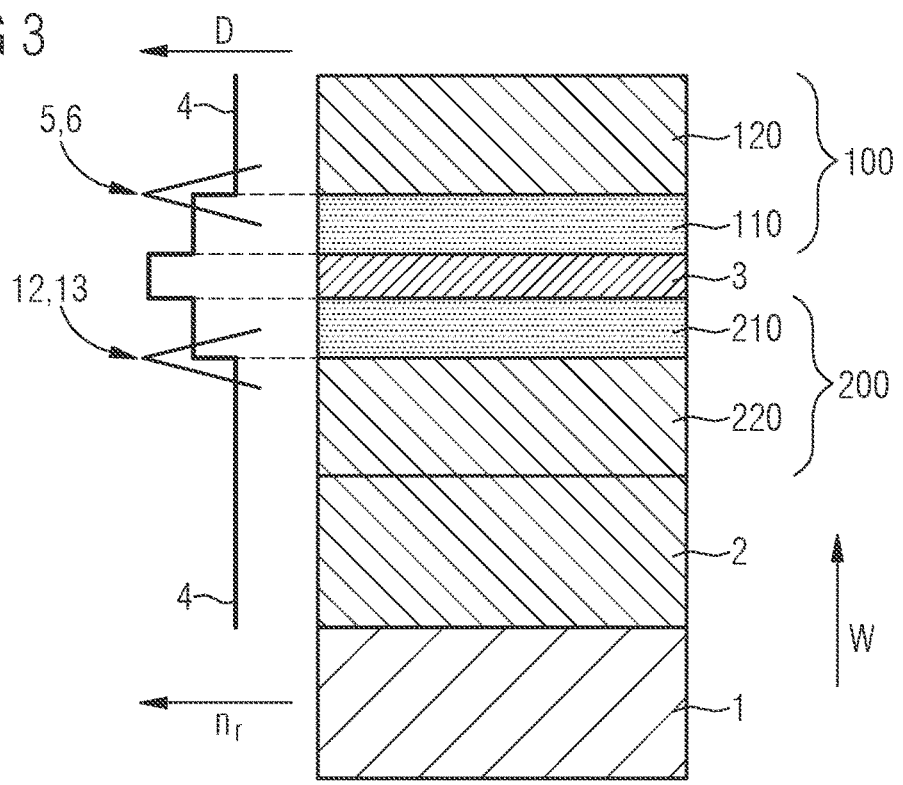
FIG. 3 shows a further embodiment of an optoelectronic component.

One aspect of the component consists in reducing a voltage drop produced by a piezoelectric field at an interface of differently constructed layers. The piezoelectric field may reduce the charge carrier density at the interface and thus bring about the electrical voltage drop at the interface. The piezoelectric field is generated by the different lattice constants of the layers adjoining one another.

In particular, the proposed solutions are suitable for layers composed of binary, ternary and/or quaternary III-V compound semiconductor material, wherein the group III element comprises Al, In and/or Ga, and wherein the group V element comprises N, As and/or Sb. Moreover, the proposed solutions are suitable for layers composed of II-VI compound semiconductor materials, in particular zinc oxide and/or or magnesium zinc oxide, wherein an electrical voltage drop occurs at the interface of the layers on account of a polarization field caused by the different construction of the layers. At these interfaces, too, the voltage drop may be at least attenuated with the aid of the peak doping regions.

The arrangement described is suitable, in particular, for the material system aluminum gallium indium nitride, which constitutes a piezoelectric material. Particularly at heterointerfaces between materials having different aluminum contents and/or indium contents, a voltage drop may occur on account of the piezoelectric effects.

If the layers of the component are grown on the substrate, for example, with a surface terminated with a group III element such as, e.g., Ga, Al or In or with a surface terminated with a group II element such as, e.g., Zn, Mg, Cd, then a positive peak doping region is provided as viewed in the growth direction on a p-side in relation to the active zone between two layers comprising different materials at a transition from a smaller band gap to a larger band gap.

Growth with a surface terminated with Ga, Al or In or Zn, Mg, Cd corresponds to growth on the (0001) plane of the wurtzite structure which is terminated by Ga, Al or In atoms, i.e., perpendicularly to the (0001) plane of the wurtzite structure along the C-axis. Growth on the surface terminated with nitrogen corresponds to growth on a (0001) plane of the wurtzite structure which is terminated with nitrogen atoms.

The direction of growth, i.e., the growth direction, may be arranged parallel to the c-axis of the lattice structure, i.e., in the direction of the C-axis or counter to the C-axis. Moreover, however, the direction of growth may also deviate from the C-axis, e.g., by +−20° or +−50° or up to +−90°. The greater the deviation from the C-axis of the wurtzite structure, the lower the polarization field formed at the interface between the differently constructed layers.

If the layers of the component are grown on the substrate, for example, with a surface terminated with a group III element or group II element, then a negative peak doping region is provided as viewed in the growth direction on an n-side in relation the active zone between layers comprising different materials at a transition from a larger band gap to a smaller band gap.

In the case of growth with a surface terminated with a group V element or group VI element, wherein the group V element is from the group N, As or Sb and the group VI element is oxygen, as viewed in the growth direction the transitions between different material layers on a p-side in relation to the active zone from a larger band gap to a smaller band gap are provided with a positive peak doping region.

In the case of growth with a surface terminated with a group V element or group VI, as viewed in the growth direction the transitions between different material layers on an n-side in relation to the active zone from a smaller band gap to a larger band gap are provided with a negative peak doping region.

Depending on the embodiment, on a p-side and/or on an n-side of a component comprising the active zone in each case at least one or more peak doping regions may be provided at the corresponding layer boundaries in order to reduce the voltage drop caused by a piezoelectric field. The term p-side denotes the layer arrangement of a pn junction that is at least partly positively doped. The term n-side denotes the layer arrangement of a pn junction that is at least partly negatively doped.

FIG. 1 shows, in a schematic illustration, an optoelectronic component, comprising a substrate 1, on which a buffer layer 2 is applied. The substrate 1 may be composed, e.g., of sapphire, silicon or silicon carbide, GaN or $Al_xIn_yGa_{1-x-y}N$, wherein 0 may be less than or equal to x, y less than or equal to 1. In the example illustrated, e.g., GaN is used as the substrate 1. Moreover, in the example illustrated, a buffer layer is grown on a Ga-terminated surface of the substrate parallel to the c-axis. The growth direction W is illustrated in the form of an arrow and proceeds from the bottom upward. A second layer arrangement 200 is provided on the buffer layer 2, wherein, in the exemplary embodiment illustrated, the second layer arrangement 200 comprises a second layer 220 arranged on the buffer layer 2. A second waveguide layer 210 is arranged on the second layer 220. An active zone 3 is arranged on the second waveguide layer 210. A first layer arrangement 100 is arranged on the active zone 3. In the exemplary embodiment illustrated, the first layer arrangement 100 comprises only a first layer 120. The first and second layer arrangements 100, 200 are produced from semiconducting material. The first layer 120 constitutes a cladding layer and is produced from gallium nitride, for example. The active zone 3 comprises quantum well structures, for example, which may comprise indium gallium nitride, for example. The second waveguide layer 210 comprises indium gallium nitride, for example. The second layer 220 is formed as a cladding layer and comprises gallium nitride, for example. The first and second layer arrangements are thus also grown with a Ga-terminated surface.

A profile of a refractive index 4 and a profile of a doping D are illustrated schematically alongside the illustration of the layer arrangement. It is clearly evident here that the first layer 120 and second layer 220 formed as cladding layers comprise a lower refractive index than the second waveguide layer 210. The active zone 3 comprises a higher refractive index than the second waveguide layer 210. Moreover, a negative doping 12 is illustrated schematically in the illustration of the refractive index 4. Furthermore, the band gap falls from the second layer 220 in the growth direction to the second waveguide layer 210. An electrical voltage drop thus arises at this interface on account of a piezoelectric field. In order to reduce the voltage drop, the negative doping 12 comprises a negative first peak doping region 13 arranged in the boundary region between the second waveguide layer 210 and the second layer 220.

Instead of the materials described, the optoelectronic component in FIG. 1 may also be constructed from other materials. A special feature of the component consists in the arrangement of the negative first peak doping region 13 in the boundary region between the second waveguide layer 210 and the second layer 220, configured as a cladding layer.

FIG. 2 shows a further embodiment of a optoelectronic component in a schematic illustration. In the illustration, although a substrate is no longer present above the second layer 220, the second layer 220 was deposited, as in FIG. 1, with a Ga-terminated surface onto a substrate, for example, a GaN substrate. The growth direction W is illustrated in the form of an arrow and proceeds from the top downward. In this embodiment, the first layer arrangement 100 comprises a further first layer 130, on which a first layer 120 is arranged. A first waveguide layer 110 is arranged on the first layer 120. The active zone 3 is arranged on the first waveguide layer 110. A second layer 220, configured as a cladding layer, is arranged on the active zone 3. The first layer arrangement 100 is at least partly positively doped.

A profile of a refractive index 4 and a profile of a doping D are illustrated schematically alongside the illustration of the layer arrangement. It is clearly evident here that the active zone comprises a greater refractive index than the adjacent first waveguide layer 110. Moreover, the cladding layer 220 comprises a lower optical refractive index than the first waveguide layer 110. Furthermore, the first layer 120, likewise configured as a cladding layer, comprises a lower refractive index than the first waveguide layer 110. Moreover, a first peak doping region 6 of the positive doping 5 is provided in the boundary region between the first waveguide layer 110 and the first layer 120.

Moreover, the band gap rises from the first waveguide layer 110 in the direction of the growth direction W to the first layer 120. An electrical voltage drop thus arises at this interface on account of a piezoelectric field. In order to reduce the voltage drop, the positive doping 5 comprises a first peak doping region 6 arranged in the boundary region between the first waveguide layer 110 and the first layer 120.

The active zone 3 is configured, for example, in the form of quantum wells comprising indium gallium nitride. Moreover, for example, the first waveguide layer 110 is configured in the form of indium gallium nitride. Furthermore, the second layer 220 and the first layer 120 are configured in the form of gallium nitride. The first and second layer arrangements are thus also grown with a Ga-terminated surface.

FIG. 3 shows a further embodiment of an optoelectronic component constituting a combination of the arrangements in FIGS. 1 and 2. In the example illustrated, GaN is used as the substrate 1. Moreover, in the example illustrated, a buffer layer is grown on a Ga-terminated surface of the GaN substrate. The growth direction W is illustrated in the form of an arrow and proceeds from the bottom upward. A buffer layer 2 is arranged on the substrate 1. A second layer 220 comprising gallium nitride, for example, is arranged on the buffer layer 2. The second layer 220 constitutes a cladding layer. A second waveguide layer 210 is arranged on the second layer 220. The second waveguide layer 210 may comprise indium gallium nitride, for example. The active zone 3 is arranged on the second waveguide layer 210. The active zone 3 may comprise quantum wells, for example, which comprise indium gallium nitride. A first waveguide layer 110 is arranged on the active zone 3. The first waveguide layer 110 may comprise indium gallium nitride. A first layer 120 configured as a cladding layer is arranged on the first waveguide layer 110. The first layer 120 may comprise gallium nitride. The first layer arrangement 100 comprising the first waveguide layer 110 and the first layer 120 is positively doped. The second layer arrangement 200 comprising the second waveguide layer 210 and the second layer 220 is at least partly negatively doped. The first and second layer arrangements are thus also grown with a Ga-terminated surface corresponding to the GaN substrate.

A profile of a refractive index 4 and a profile of a doping D are illustrated schematically alongside the illustration of the layer arrangement. The active zone 3 comprises a higher refractive index 4 than the first waveguide layer 110 and respectively second waveguide layer 210 adjoining said active zone. The refractive indexes of the first and second waveguide layers 110, 210 may be approximately of identical magnitude. The refractive indexes of the cladding layers 120, 220 adjoining the first waveguide layer 110 and respectively the second waveguide layer 210 oppositely with respect to the active zone 3 comprise a lower refractive index than the first and respectively the second waveguide layer 110, 210.

Furthermore, the band gap falls from the second layer 220 in the growth direction to the second waveguide layer 210. An electrical voltage drop thus arises at this interface on account of a piezoelectric field. In order to reduce the voltage drop, the negative doping 12 comprise a negative first peak doping region 13 arranged in the boundary region between the second waveguide layer 210 and the second layer 220. Moreover, the band gap rises from the first waveguide layer 110 in the direction of the growth direction W to the first layer 120. An electrical voltage drop thus arises at this interface on account of a piezoelectric field. In order to reduce the voltage drop, the positive doping 5 comprises a first peak doping region 6 arranged in the boundary region between the first waveguide layer 110 and the first layer 120.

Figure 4:
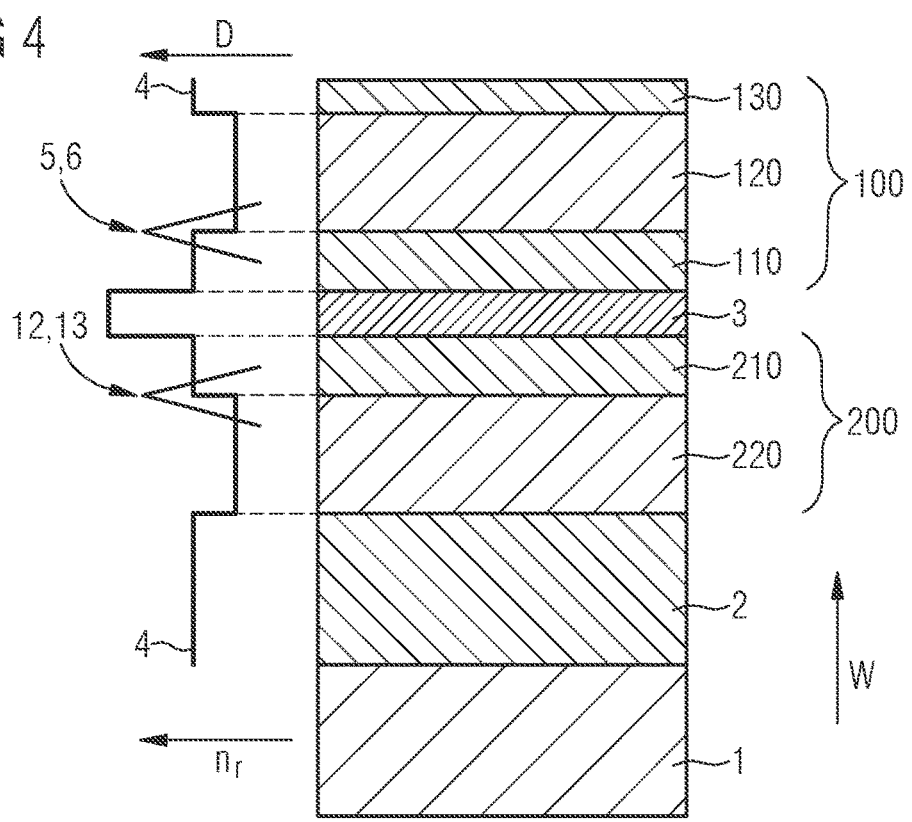
FIG. 4 shows a further embodiment of a symmetrical optoelectronic component.

FIG. 4 shows a further embodiment of an optoelectronic component, wherein a buffer layer 2 is arranged on a substrate 1. In the example illustrated, GaN is used as the substrate 1. Moreover, in the example illustrated, a buffer layer is grown on a Ga-terminated surface of the GaN substrate. The growth direction W is illustrated in the form of an arrow and proceeds from the bottom upward. A second layer 220 configured as a cladding layer is arranged on the buffer layer 2. The second layer 220 may comprise aluminum gallium nitride. A second waveguide layer 210 is arranged on the second layer 220. The second waveguide layer 210 may comprise gallium nitride. The active zone 3 is arranged on the second waveguide layer 210. The active zone 3 may comprise quantum wells comprising indium gallium nitride, for example. A first waveguide layer 110 is arranged on the active zone 3. The first waveguide layer 110 may comprise gallium nitride. A first layer 120 is arranged on the first waveguide layer 110. The first layer 120 may comprise aluminum gallium nitride and be configured as a cladding layer. A further first layer 130 may be arranged on the first layer 120. The further first layer 130 may comprise gallium nitride and be configured as a cover layer. The first and second layer arrangements are thus also grown on a Ga-terminated surface corresponding to the GaN substrate.

A profile of a refractive index 4 and a profile of a doping D are illustrated schematically alongside the illustration of the layer arrangement. Moreover, the illustration schematically illustrates peak doping regions 6, 13 of the positive doping 5 in the region of the first layer arrangement 100 and of the negative doping 12 in the region of the second layer arrangement 200 in the boundary region between the first waveguide layer 110 and the first layer 120 and respectively between the second waveguide layer 210 and the second layer 220. Furthermore, the band gap falls from the second layer 220 in the growth direction to the second waveguide layer 210. An electrical voltage drop thus arises at this interface on account of a piezoelectric field. In order to reduce the voltage drop, the negative doping 12 comprises a negative first peak doping region 13 arranged in the boundary region between the second waveguide layer 210 and the second layer 220. Moreover, the band gap rises from the first waveguide layer 110 in the direction of the growth direction W to the first layer 120. An electrical voltage drop thus arises at this interface on account of a piezoelectric field. In order to reduce the voltage drop, the positive doping 5 comprises a first peak doping region 6 arranged in the boundary region between the first waveguide layer 110 and the first layer 120.

The buffer layer explained in FIGS. 1 to 4 may comprise a plurality of layers. Moreover, the buffer layer may also be dispensed with.

Figure 5:
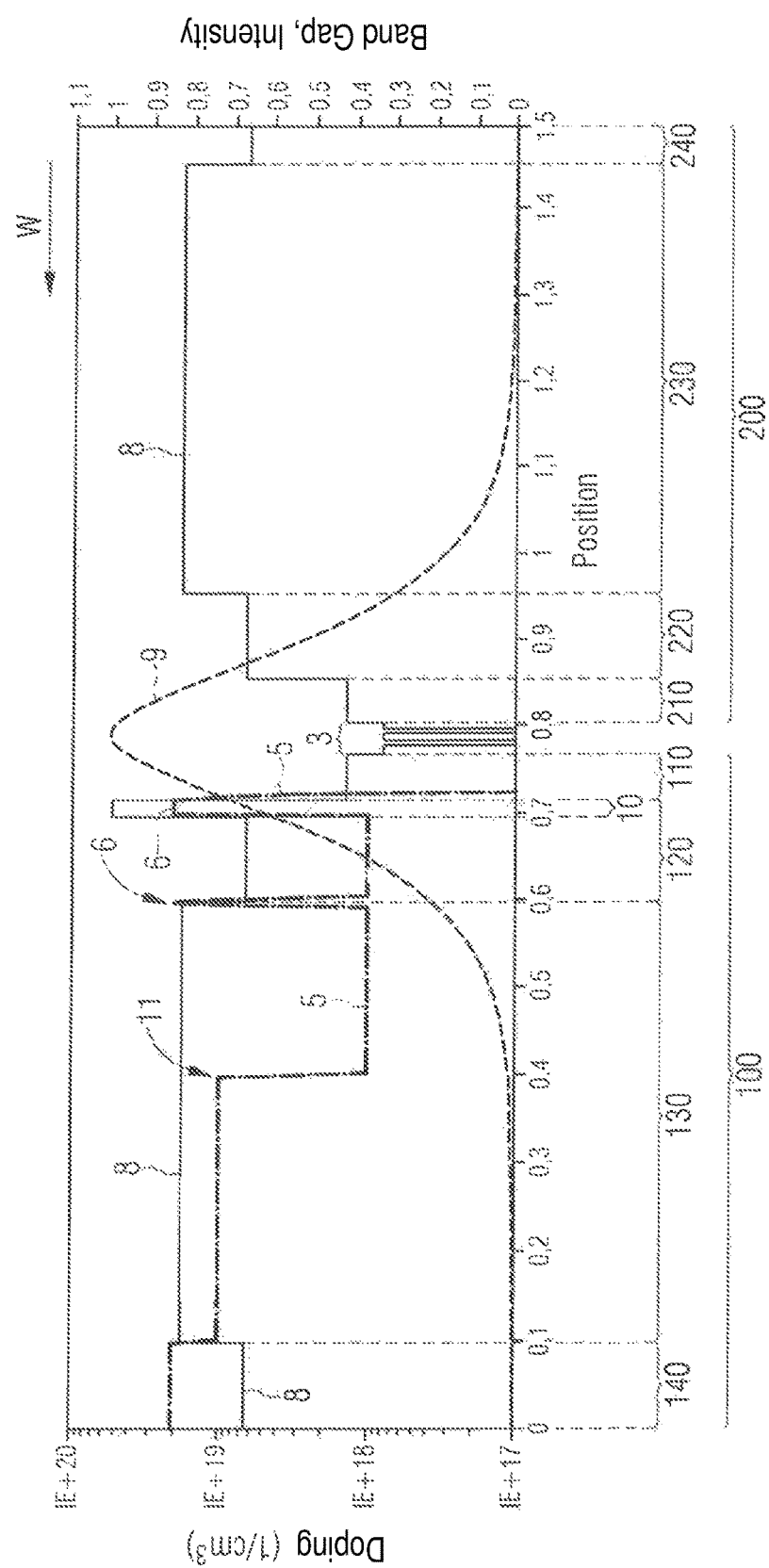
FIGS. 5 to 14 show various embodiments of an optoelectronic component comprising different positive doping curves and different layer structures of the first layer arrangement.

FIG. 5 shows a construction of an optoelectronic component in a schematic illustration. In this case, alongside the layer structure the illustration shows a profile of the band gap 8, a profile of a positive doping 5 and a profile of an intensity 9 of an electromagnetic wave that is generated during the operation of the component. The band gap constitutes a gap in energy between a conduction band and the valance band. The component comprises an active zone 3, wherein the active zone 3 is arranged between a first layer arrangement 100 and a second layer arrangement 200. The active zone 3 comprises, for example, quantum wells arranged between barrier layers.

In the example illustrated, GaN is used as the substrate 1. Moreover, in the example illustrated, a buffer layer is grown on a Ga-terminated surface of the GaN substrate. The growth direction W is illustrated in the form of an arrow and proceeds from right to left. The planes of the layers are arranged perpendicularly to the growth direction W.

The first layer arrangement 100 comprises a first waveguide layer 110, which adjoins the active zone 3. The first waveguide layer constitutes a spacer layer, which is preferably undoped. At the opposite location with respect to the active zone 3, a blocking layer 10 is provided in a manner adjoining the first waveguide layer 110, said blocking layer constituting a barrier for electrons. Adjoining the blocking layer 10, a first layer 120 is provided, which is likewise configured as a waveguide layer. Adjoining the first layer 120, a further first layer 130 is provided, which is configured as a cladding layer. Adjoining the further first layer 130, an additional first layer 140 is provided.

Moreover, the band gap 8 rises from the first layer 110 in the direction of the growth direction W to the further first layer 130. An electrical voltage drop thus arises at this interface on account of a piezoelectric field. In order to reduce the voltage drop, the positive doping 5 comprises a first peak doping region 6 arranged in the boundary region between first layer 120 and the further first layer 120.

The first layer arrangement 100 comprises layers composed of semiconductor material, wherein the individual layers comprise different compositions. FIG. 5 schematically illustrates the band gap 8 for free charge carriers for the various layers. The differences in the band gaps 8 of the individual layers are merely illustrated schematically. The differences in the band gaps 8 of the individual layers may be larger or smaller depending on the materials used for the layers and the dopings. The profile of the refractive indexes of the layers is also analogous to the profile of the band gap, but is not explicitly illustrated. Moreover, the boundary regions between the individual layers are illustrated schematically by dashed vertical lines.

The first waveguide layer 110 may comprise gallium nitride or indium gallium nitride, for example. The blocking layer 10 may comprise aluminum gallium nitride or aluminum indium gallium nitride, for example. The aluminum proportion may be in the range of between 8 and 40%. The first layer 120 may comprise gallium nitride or indium gallium nitride. By way of example, the first waveguide layer 110 and the first layer 120 may differ in the indium proportion. The indium proportion in the first waveguide layer and in the first layer 120 may be in the range of between 0 and 10%. The active zone 3 may comprise a quantum well structure comprising indium gallium nitride.

Moreover, the active zone 3 may also comprise a quantum well structure comprising gallium nitride or aluminum gallium nitride. In this embodiment, the first waveguide 110 and the first layer 120 may also consist of aluminum gallium nitride, wherein the aluminum proportion differs between the first waveguide 110 and the first layer 120.

The further first layer 130 may consist of aluminum gallium nitride, aluminum indium gallium nitride. In particular, the aluminum proportion may vary between 1 and 10%. The additional first layer 140 may comprise gallium nitride, for example. Depending on the embodiment chosen, the individual layers of the first layer arrangement 100 may comprise different positive dopings.

The second layer arrangement 200 comprises a second waveguide layer 210 adjoining the active zone 3. The second waveguide layer 210 may consist of gallium nitride or of indium gallium nitride. Moreover, the second waveguide layer 210 may consist of gallium nitride or aluminum gallium nitride, for example. A second layer 220 is adjacent to the second waveguide layer 210. The second layer 220 is likewise configured as a waveguide layer in the exemplary embodiment illustrated. By way of example, the second layer 220 may consist of aluminum gallium nitride, gallium nitride or indium aluminum nitride. A further second layer 230 is adjacent to the second layer 220. The further second layer 230 is configured as a cladding layer and may consist of aluminum gallium nitride, indium gallium nitride, aluminum indium gallium nitride, for example. The aluminum proportion may be between 1 and 10%, for example.

An additional second layer 240 is adjacent to the further second layer 230. The additional second layer 240 may consist of gallium nitride, for example. The intensity 9 of the electromagnetic wave is high predominantly in the region of the active zone 3 and of the adjoining waveguide 110, 120, 210, 220.

One aspect of the present technical solution consists in providing an optoelectronic component in which the positive or negative doping in the region of a predefined minimum identity is below a predefined maximum doping.

In the present example, the first waveguide layer 110 is undoped. Not until in the blocking layer 10 does the positive doping rise to values of more than $1\times10^{19}$ 1/cm$^3$. Depending on the embodiment chosen, a peak doping region 6 may be formed at the interface between the first waveguide layer 110 and the blocking layer 10 in order to reduce the voltage drop. In this case, therefore, the positive doping 5 already rises in the otherwise undoped first waveguide layer 110.

However, the positive doping falls again to a value of $1\times10^{18}$ 1/cm$^3$ after the blocking layer 10 in the first layer 120. In the example illustrated, the doping in the first layer 120 right into the boundary region with respect to the further first layer 130 remains in the region of $1\times10^{18}$/cm$^3$. Not until shortly before the boundary region does the positive doping 5 rise in a positive first peak doping region 6 up to a value of $2\times10^{19}$ 1/cm$^3$.

In the further first layer 130, the doping falls again from this maximum value of the first peak doping region 6 to a lower value. In this exemplary embodiment, the lower value is a doping of $1\times10^{18}$/cm$^3$. It is only starting from a defined distance with respect to the active zone 3 that the positive doping 5 rises again via a step 11 to a value of approximately $1\times10^{19}$/cm$^3$ within the further first layer 130. The defined distance may be somewhat before the center of the further first layer 130. At the transition from the further first layer 130 to the additional first layer 140, the positive doping 5 once again rises further up to a value of $2\times10^{19}$/cm$^3$, in order to achieve a greater surface doping. The doping remains constant in the additional first layer 140.

What is achieved with the aid of the peak doping regions 6 is that good optoelectronic properties may be provided despite the low positive doping in the first layer 120, which is likewise used as a waveguide, and in the further first layer 130. Depending on the embodiment chosen, the height of the first peak doping region 6 which is arranged nearer to the active zone 3 and a greater intensity of the electromagnetic wave 9 is therefore present may be chosen to be smaller than the peak doping region 6 which is further away from the active zone 3. The step 11 at which the positive doping 5 within the further first layer 130 rises likewise leads to an improved electrical conductivity and thus to a lower resistance.

On account of the first peak doping region 6, which constitutes a positive doping peak and is provided, as viewed in the growth direction W, at the transition region between a layer having a small band gap 8 and a layer having a large band gap 8, a good forward voltage Uf is achieved.

Figure 6:
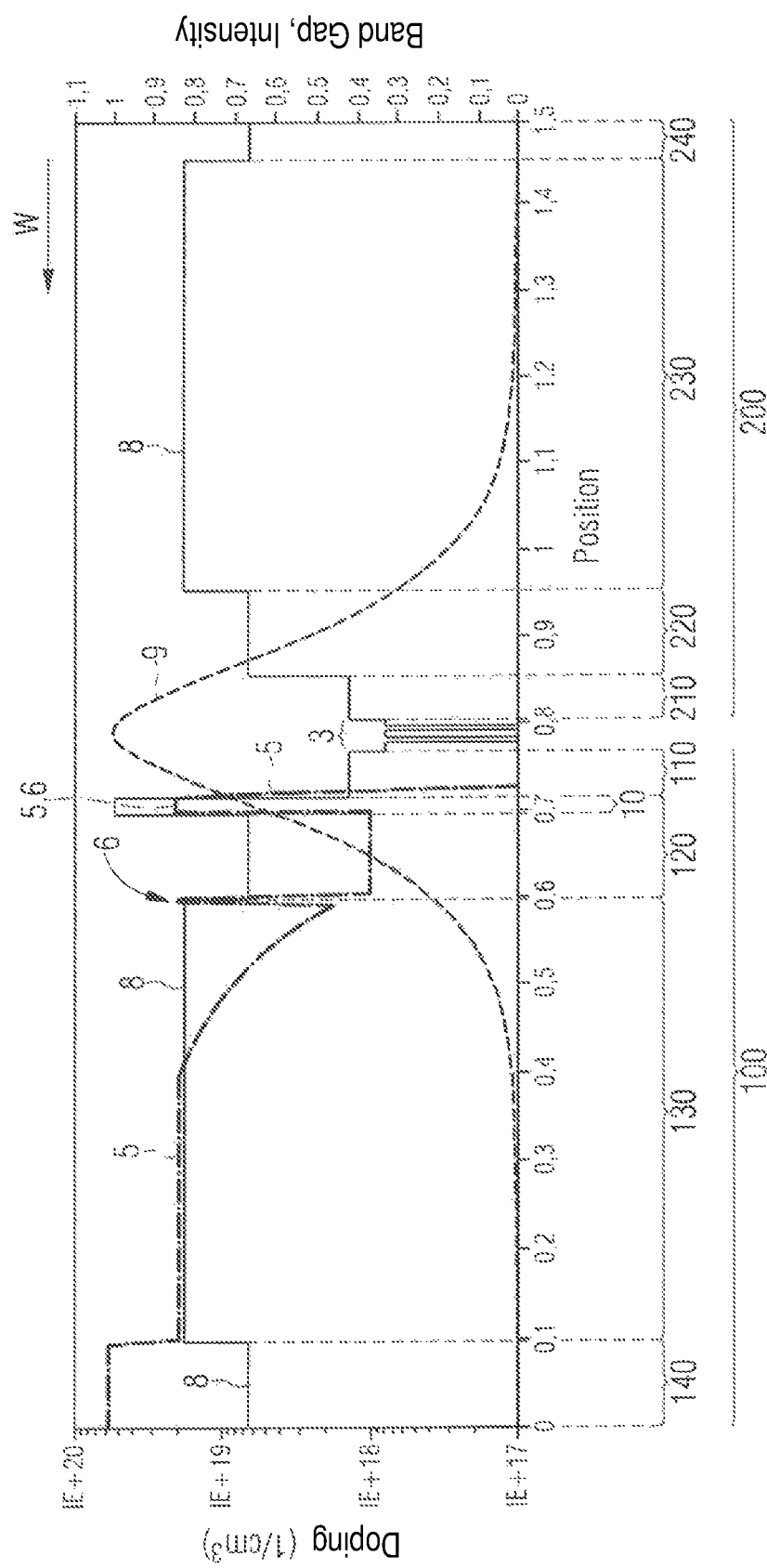

FIG. 6 shows a further embodiment of an optoelectronic component which is constructed in accordance with the embodiment in FIG. 5 with regard to the layer structure and the growth direction W. However, the embodiment in FIG. 6 differs relative to the embodiment in FIG. 5 in the profile of the positive doping 5 in the first layer arrangement 100. The positive doping is identical to the profile in FIG. 5 up to a maximum of the first peak doping region 6. However, the doping rises after the fall of the first peak doping region 6 within the further first layer 130 in the form of a ramp, preferably continuously up to a value of $2\times10^{19}$ 1/cm$^3$. The value of $2\times10^{19}$ 1/cm$^3$ is attained, e.g., within one third or one half of the thickness of the further first layer 130. Afterward, the doping rises at the transition between the further first layer 130 and the additional first layer 140 to values of $4\times10^{19}$. Consequently, a higher doping is achieved within the further first layer 130 and a higher doping is achieved within the additional first layer 140 by comparison with the embodiment in FIG. 5. A compromise is thus chosen for a somewhat increased absorption on account of the higher doping and an improved forward voltage Uf. A centering of the electromagnetic wave in the region of the active zone is additionally realized.

Figure 7:
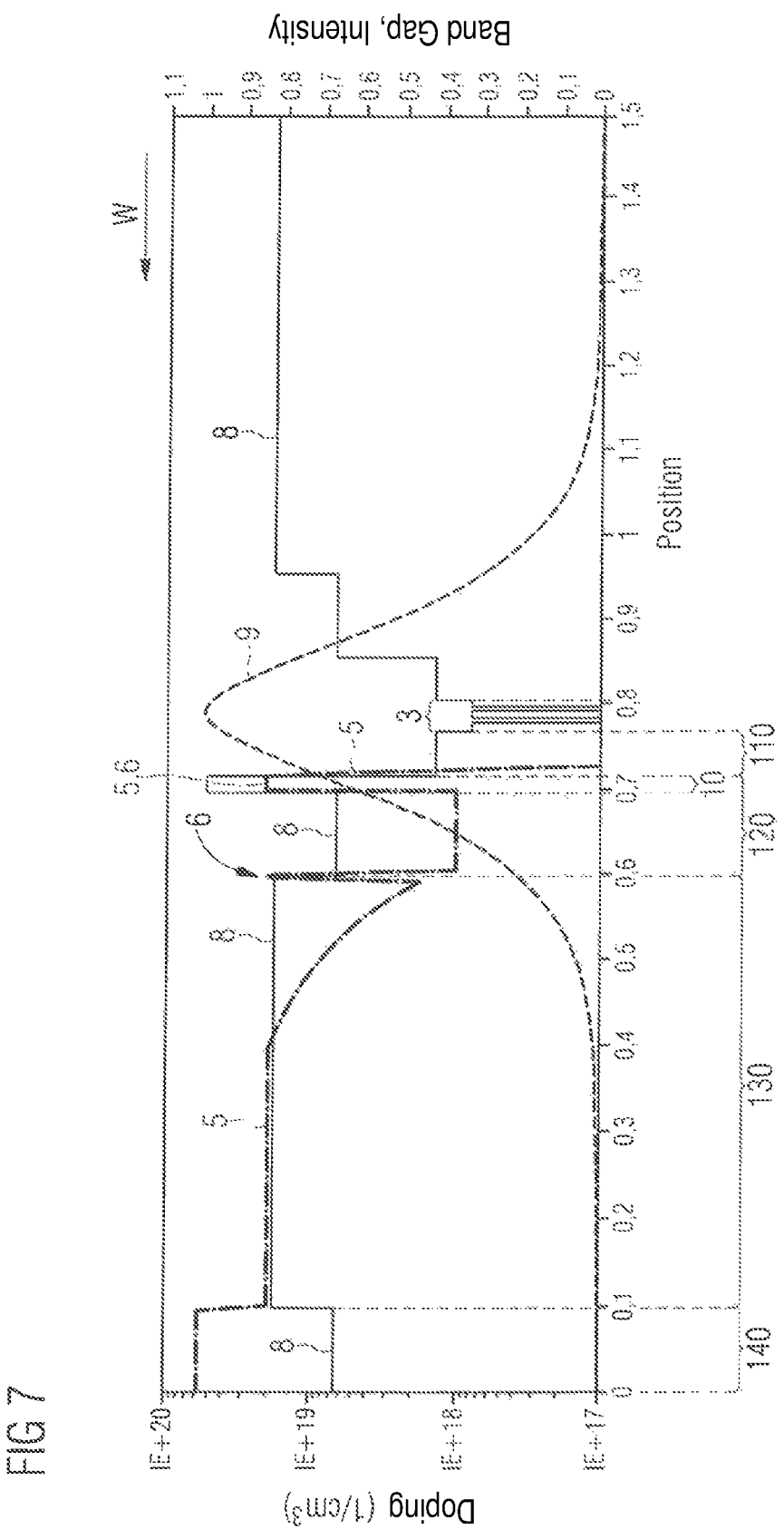

FIG. 7 shows a further embodiment, which corresponds to the embodiment in FIG. 6 for the active zone 3, the first layer arrangement 100 and the positive doping 5. In contrast to the embodiment in FIG. 6, however, the intensity 9 of the electromagnetic wave is shifted in the direction of the second layer arrangement 200. This is achieved, for example, by forming the second waveguide layer 210 such that it is larger, that is to say thicker, in comparison with the second waveguide layer 210 in FIG. 6. Depending on the embodiment chosen, it is possible to achieve a shift in the intensity of the wave in the direction of the second layer arrangement 200, that is to say in the direction of the n-side, by means of a corresponding change in the material composition. The shift in the optical wave may be achieved, for example, by an increase in the indium concentration or by a decrease in the aluminum concentration in the second layer arrangement 200 or by a corresponding wider thickness of the second waveguide on the n-side.

As a result of the shift in the intensity 9 of the electromagnetic wave in the direction of the n-side, the intensity of the electromagnetic wave on the p-side, that is to say in the region of the first layer arrangement 100, comprises a lower intensity. A lower absorption of the electromagnetic wave is thus caused by the positive doping in the layer arrangement 100.

Figure 8:
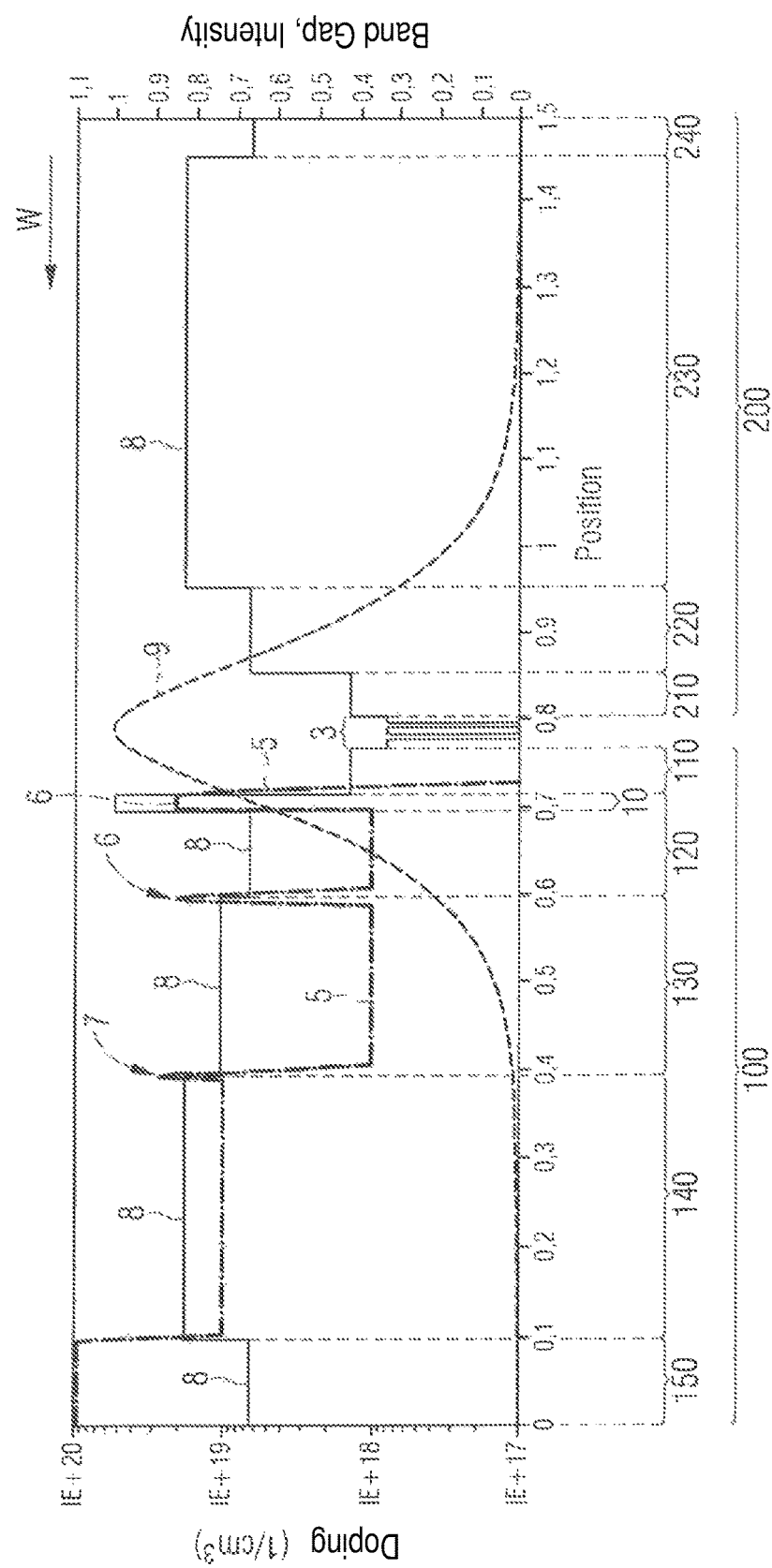

FIG. 8 shows a further embodiment of an electro-optical component configured in relation to the second layer arrangement 200 in accordance with FIG. 5. Moreover, the first waveguide layer 110, the blocking layer 10 and the first layer 120 are configured in accordance with FIG. 5. Furthermore, the positive doping 5 right into the end region of the further first layer 130 is also configured in accordance with FIG. 5. In contrast to FIG. 5 the additional first layer 140 comprises a larger band gap than the further first layer 130. Moreover, the additional first layer 140 is adjoined by a terminating layer 150 comprising a smaller band gap than the additional first layer 1. The doping 5 in the transition region between the further first layer 130 comprises a second peak doping region 7 comprising a doping of $2\times10^{19}$ 1/cm$^3$. A second peak doping region 7 is thus obtained whose maximum doping is above the maximum doping of the first peak doping region 6. In the exemplary embodiment illustrated, the maximum doping of the first peak doping region 6 is in the region of $1\times10^{19}$ 1/cm$^3$. This corresponds to the maximum doping in the blocking layer 10.

Within the additional first layer 140, the doping decreases to a value of $2\times10^{19}$/cm$^3$. Furthermore, the doping rises at the transition between the additional layer 140 and the terminating layer 150 to values of $1\times10^{20}$/cm$^3$. A multi-stage p-type cladding layer is achieved with the aid of this embodiment, wherein a better forward voltage Uf is achieved by means of a smaller band gap in the region of the further first layer 130. The additional first layer 140 is the first to comprise the band gap which the further first layer 130 already comprises in the embodiment in FIG. 5. A better forward voltage Uf is thus achieved by means of a lower aluminum content in the region of the reduced doping of the further first layer 130.

Figure 9:
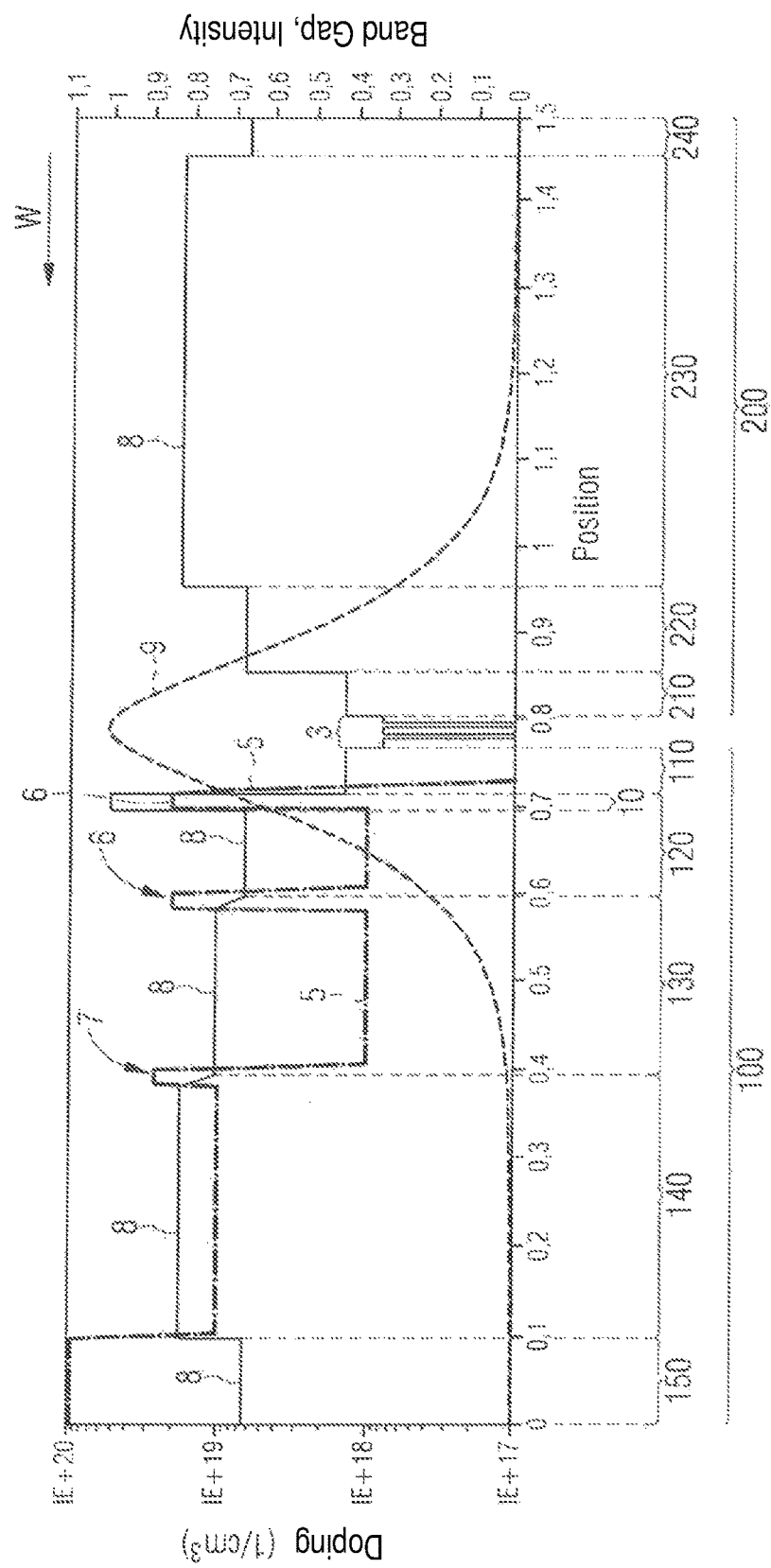

FIG. 9 shows a further embodiment, which substantially corresponds to the embodiment in FIG. 8, but wherein the material transition between the first layer 120 and the further first layer 130 is embodied in such a way that the band gap rises in the form of a ramp. The transition between the further first layer 130 and the additional first layer 140 is likewise configured in such a way that the band gap rises in the form of a ramp. In an analogous manner, the band gap 8 also changes in the form of ramps.

Furthermore, the first and second peak doping regions 6, 7 in the transition region between the first layer 120 and the further first layer 130 and, respectively, between the further first layer 130 and the additional first layer 140 are embodied with a width at least equal to the way in which the ramps are embodied. This means that the doping rises in each case in the layer with the smaller band gap and it is not until after reaching the end of the ramp at the higher band gap that the doping 5 falls again. Both in the embodiment in FIG. 8 and in the embodiment in FIG. 9, the positive doping 5 is lightly doped in the region of a high intensity 9 of the electromagnetic wave, that is to say in the range of greater than 5% of the maximum intensity. A lower absorption is realized as a result.

On account of the heterojunctions of the materials from a small to a large band gap in the form of a ramp, an improved forward voltage Uf is achieved. Moreover, the maximum doping of the second peak doping region 7 is preferably greater than the maximum doping of the first peak doping region 6.

Figure 10:
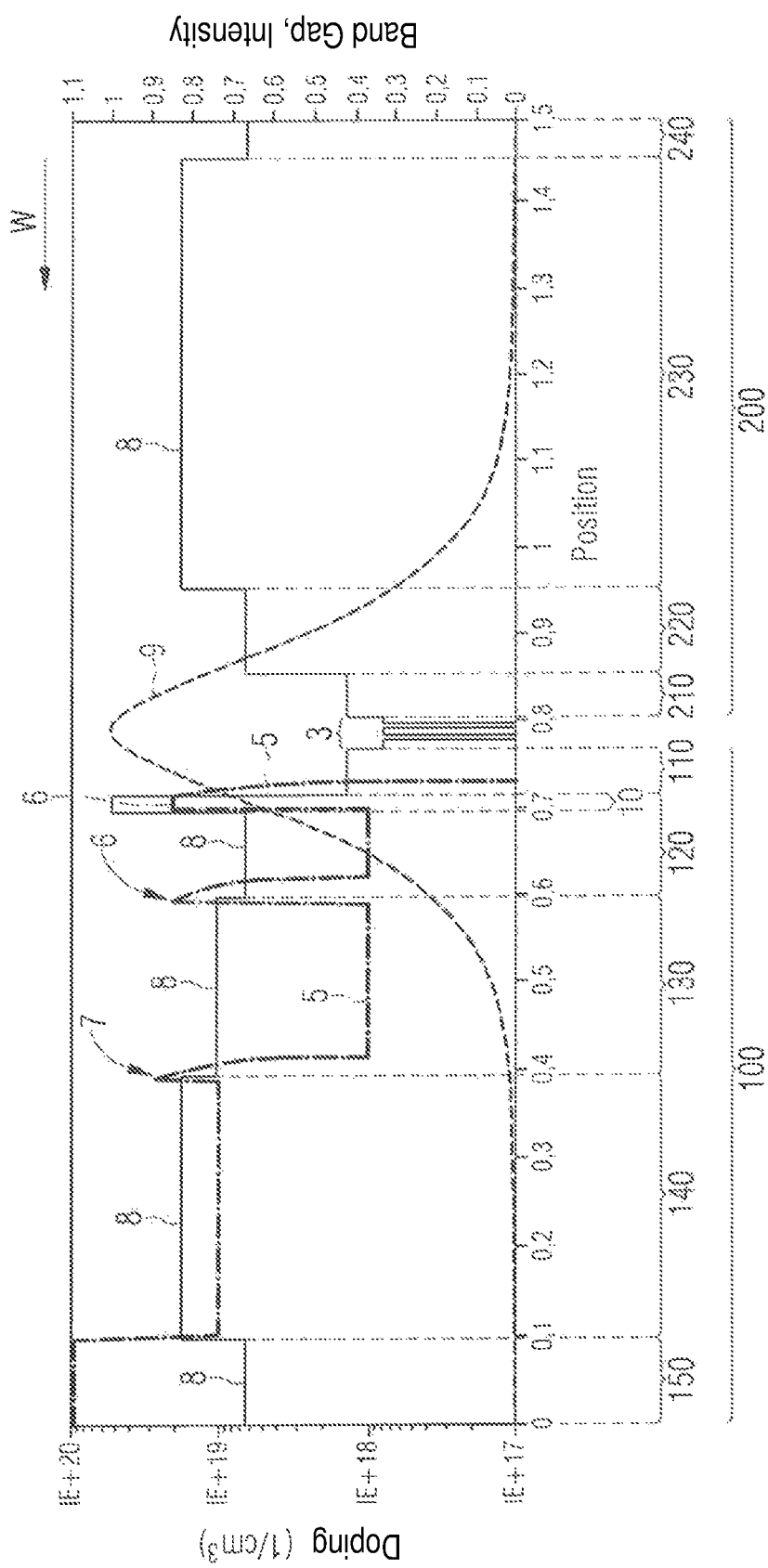

FIG. 10 shows an embodiment of an electro-optical component which is configured substantially in accordance with FIG. 8, but wherein, in contrast to the embodiment in FIG. 8, the doping 5 in the region of the peak doping regions 6, 7 rises more slowly in the form of a ramp. This means that the doping already begins to rise at a greater distance from the material transition to the next layer. The fall may proceed just as steeply as in the embodiment in FIG. 8.

As a result a wider region is achieved in which the doping 5 rises at the end region of the first layer 120 and, respectively, at the end region of the further first layer 130. It is thus ensured that a sufficiently high doping is provided at the heterointerface between the layers comprising different band gaps. A good forward voltage Uf is achieved as a result.

Figure 11:
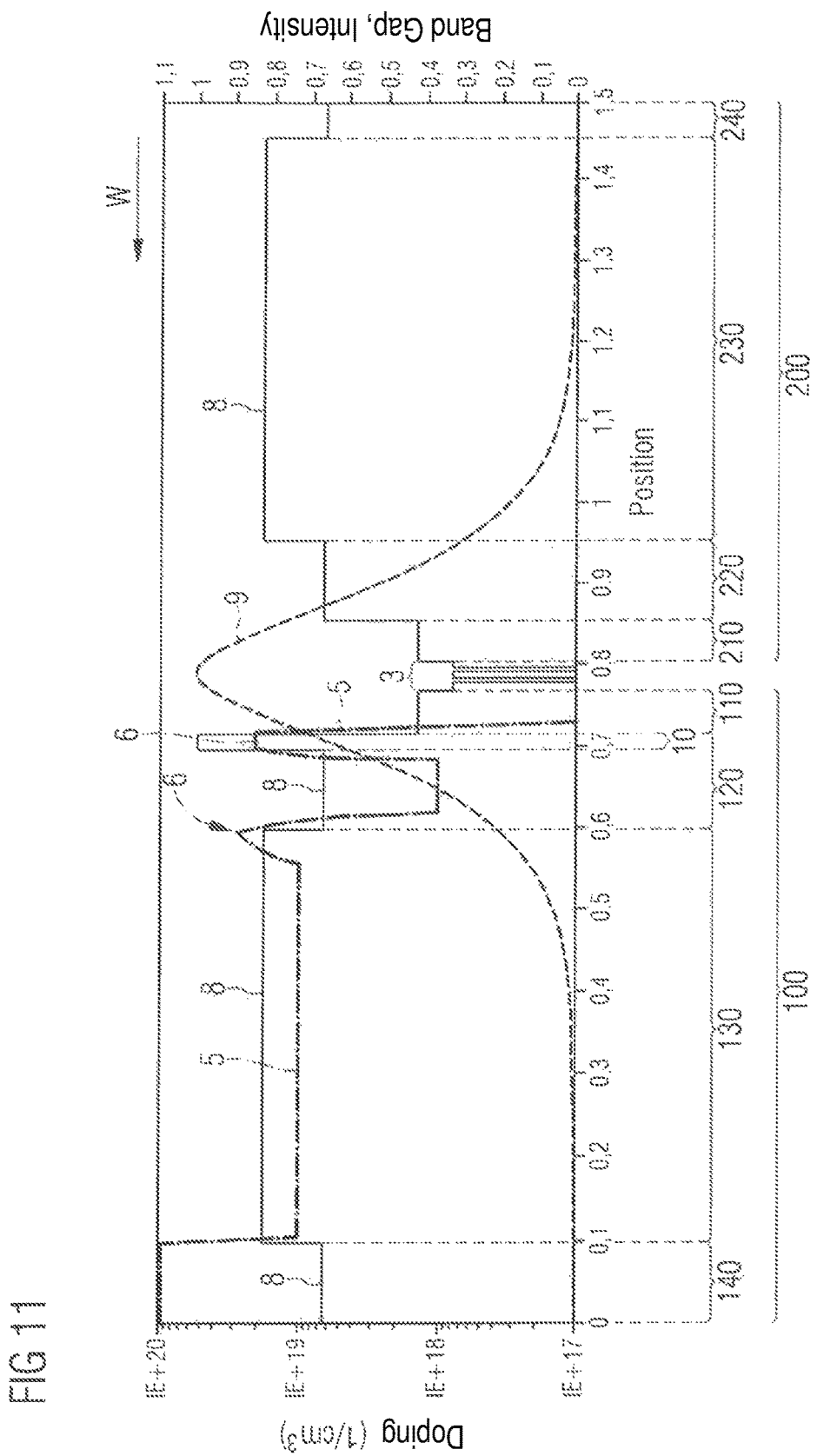

FIG. 11 shows a further embodiment of a component constructed in relation to the configuration of the layer arrangements 100, 200 in accordance with FIG. 5. However, the doping 5 differs relative to the configuration in FIG. 5 in that the positive doping 5 already rises at a defined distance of the material boundary in the direction of a material comprising a larger band gap. Moreover, a rise and/or a fall in the doping 5, for example, from the blocking layer 10 in the direction of the first layer 120 are/is also embodied with a larger ramp. Moreover, the rising of the doping 5 in the transition region between the first layer 120 and the further first layer 130 already begins at a greater distance from the layer boundary.

Furthermore, a falling of the doping 5 after a maximum of the first peak doping region 6 to a lower value is embodied with a ramp. Moreover, the doping 5 in the further first layer 130 decreases only to a value of $1\times10^{19}/cm^3$. The doping ramps used at the heterojunctions have the effect that a sufficiently high doping is provided at the heterointerface between the different layers comprising the band gaps of different magnitudes. Furthermore, it is additionally possible to use a gradual decrease in the doping after the maximum value of the peak doping region 6 and/or after the blocking layer 10. A good, i.e., a low, forward voltage Uf is achieved as a result.

By way of example, the positive doping 5 may be chosen in such a way that the doping in the region of a high intensity 9 of the electromagnetic wave, that is to say at an intensity of greater than 26% of the maximum, comprises a low doping in the region of $1\times10^{18}/cm^3$.

Figure 12:
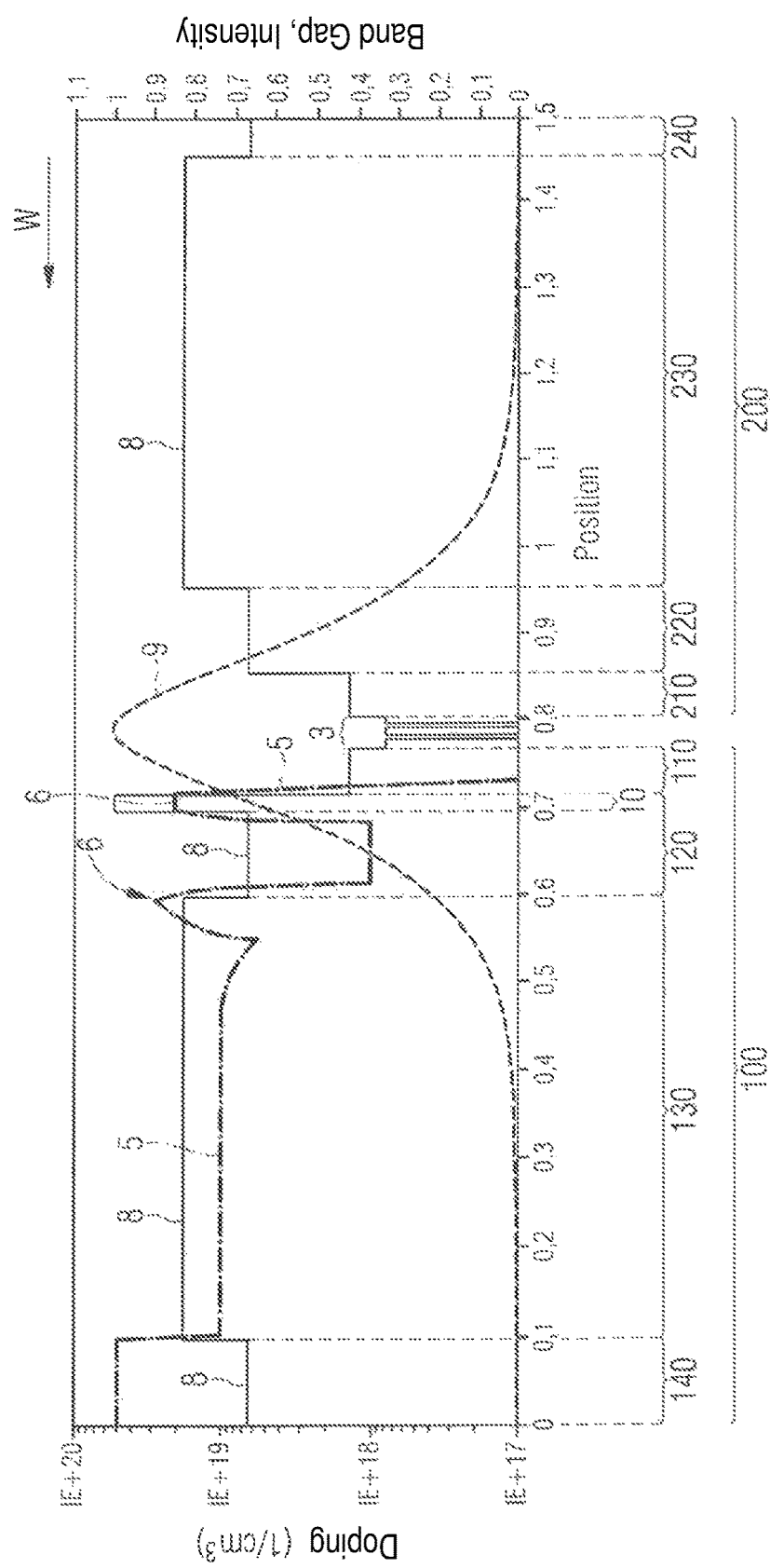

FIG. 12 shows a further embodiment, in which the layer structure corresponds to the embodiment in FIG. 11. The doping likewise corresponds to the embodiment in FIG. 10 until reaching the maximum value of the first peak doping region 6. In contrast to the embodiment in FIG. 11, the doping 5 after the fall in the peak doping region 6 in the region of the further first layer 130 does not remain constant, but rather rises to a higher value after reaching a minimum following the ramp. The minimum may be in a range of between 1 and $5\times10^{18}/cm^3$. The higher value of the doping may be at $1\times10^{19}/cm^3$. Before reaching the terminating layer 150, the positive doping 5 rises to a value of $5\times10^{19}/cm^3$. A compromise between a good forward voltage Uf and a low absorption is achieved as a result.

Figure 13:
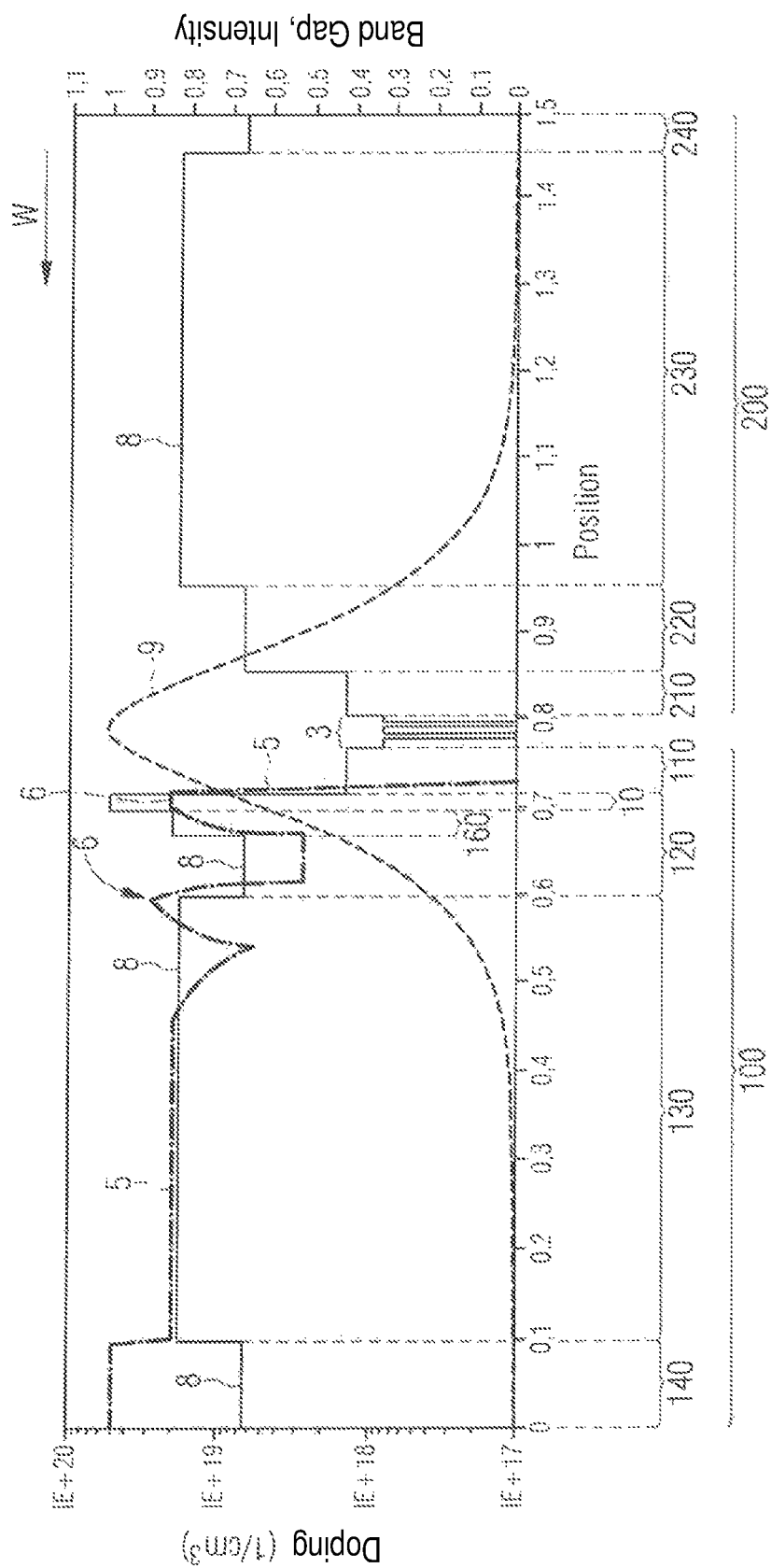

FIG. 13 shows a further embodiment of a component which corresponds to the embodiment in FIG. 12 in terms of its construction, but wherein in contrast a further cladding layer 160 is formed between the blocking layer 10 and the first layer 120. The further cladding layer 160 comprises the same band gap as the further first layer 120. The negative doping 5 decreases after the blocking layer 10 in the form of a ramp via the further cladding layer 160 and an initial region of the first layer 120 to the value of $3\times10^{18}/cm^3$.

Moreover, in contrast to the doping 5 in the embodiment in FIG. 12, the doping rises again in the form of a ramp after reaching a minimum after the first peak doping region 6 and after reaching a minimum doping value in the range of 1 to $5\times10^{18}/cm^3$ in the further first layer 130 and attains a doping in the region of $2\times10^{10}/cm^3$ within the further first layer 130.

The doping profile of the positive doping 5 is chosen in such a way that a low doping is present in the region of a high intensity 9 of the electromagnetic wave, that is to say at an intensity of greater than 17% of the maximum value. A lower absorption of the electromagnetic wave is achieved as a result. Moreover, doping ramps are provided at the heterojunction of a material from a small to a large band gap, in order to achieve a sufficiently high doping at the heterointerface, that is to say in the boundary region between the two layers. In addition, a decrease in the doping after the boundary transition may be provided gradually. A low forward voltage Uf is thus achieved. A rising doping is realized with a low intensity of the electromagnetic wave in the region of the cladding layers. This constitutes a compromise for a good forward voltage and a low absorption. Better waveguiding is achieved on account of the multi-stage cladding layer.

Figure 14:
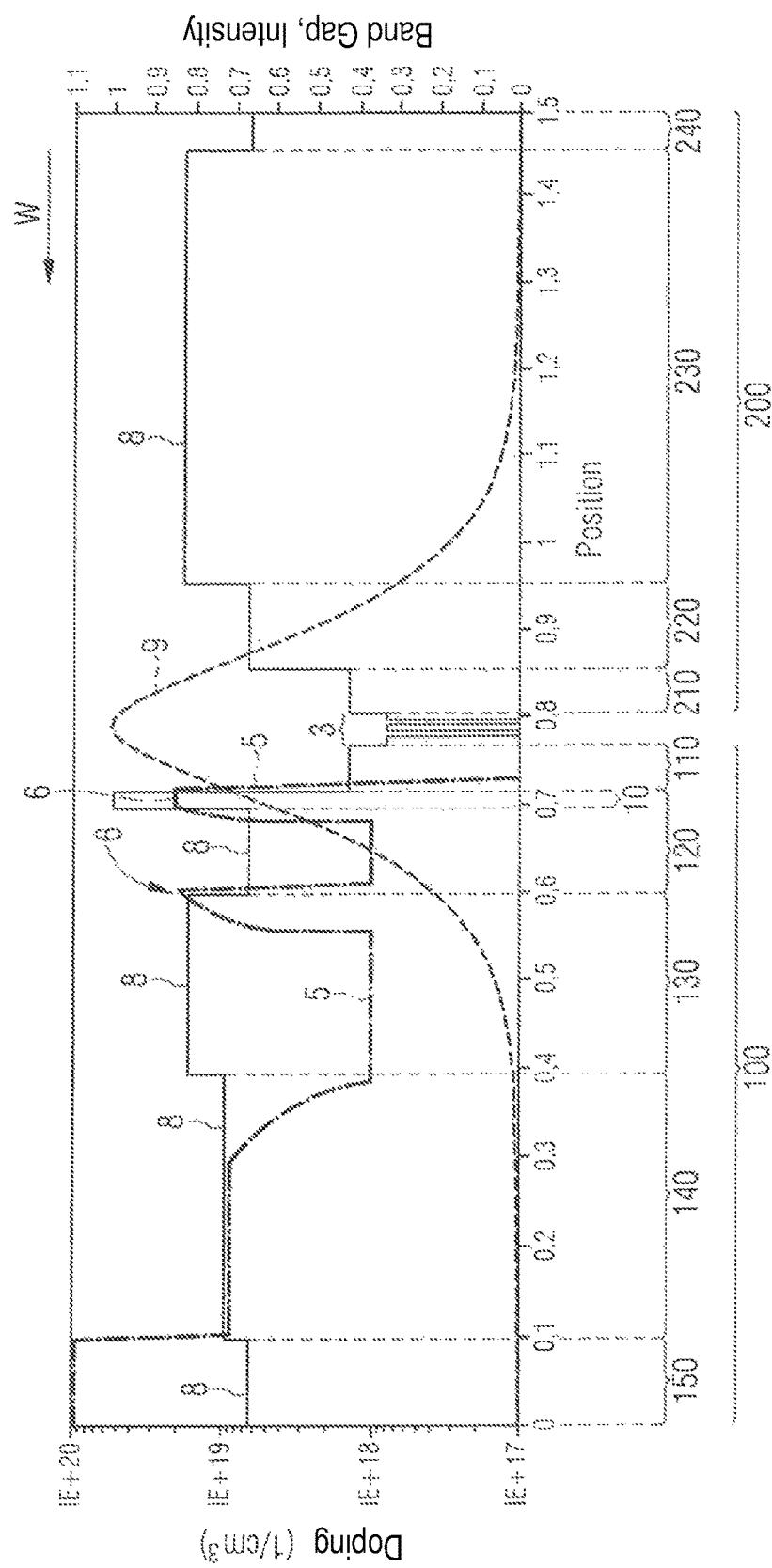

FIG. 14 shows a further embodiment, the layer structure of which corresponds to FIG. 5 for the second layer arrangement 200, the active zone 3, the first waveguide layer 110, the first layer 120, the blocking layer 10 and the further first layer 130. In contrast to the embodiment in FIG. 5, the further first layer 130 is made thinner and transitions into an additional layer 140 with a smaller band gap. A terminating layer 150 is adjacent to the additional first layer 140 and comprises an even smaller band gap than the additional first layer 140. The doping 5 falls after the first peak doping region 6 after the transition from the first layer 120 to the further first layer 130 in the form of a ramp to a value of $1\times10^{18}/cm^3$. Afterward, the positive doping 5 rises at the transition from the further first layer 130 to the additional first layer 140 up to a value of $1\times10^{19}/cm^3$ in the form of a ramp. At the transition from the additional first layer 140 to the terminating layer 150, the doping rises again to a value of $1\times10^{20}/cm^3$. The rise already takes place before reaching the end of the additional first layer 140.

The positive doping 5 provided is embodied in such a way that a low doping is present in the region comprising a high intensity 9 of the electromagnetic wave, that is to say in a range of greater than 26% of the maximum intensity. A lower absorption is achieved as a result. Moreover, doping ramps are provided at the heterojunction from a small to a high band gap, in order to achieve a sufficiently high doping at the heterointerface. Furthermore, a decrease in the doping after the heterointerface is carried out gradually. A low forward voltage Uf is provided as a result. The positive doping rises with a low intensity of the wave in the cladding region, that is to say in the region of the additional first layer 140. This constitutes a compromise for a good forward voltage Uf and a low electromagnetic absorption. Better waveguiding is achieved with the aid of the multi-stage cladding layer.

Figure 15:
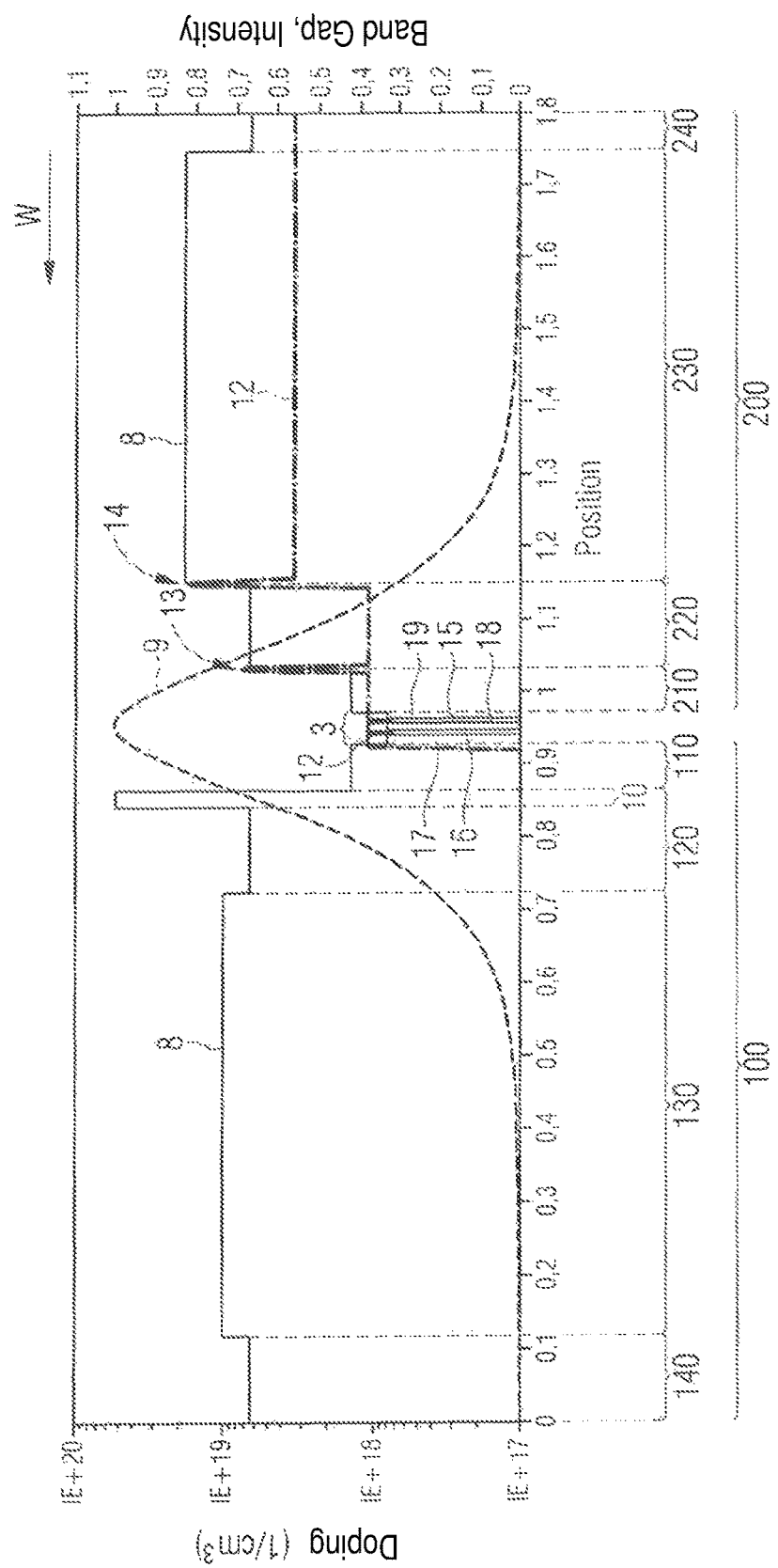
FIGS. 15 to 22 show various embodiments of the optoelectronic component comprising different doping curves and different layer structures of the second layer arrangement.

FIG. 15 shows the layer structure in accordance with FIG. 5 in a schematic illustration, the band gaps of the material layers being indicated. In the example illustrated, GaN is used as the substrate 1. Moreover, in the example illustrated, a buffer layer is grown on a Ga-terminated surface of the GaN substrate. The growth direction W is illustrated in the form of an arrow and proceeds from right to left.

In contrast to FIG. 5, the negative doping 12 in the second layer arrangement 200 is illustrated. Depending on the embodiment chosen, the active zone 3 may comprise at least two quantum wells 15, 16 each delimited by two barrier layers 17, 18, 19. The barrier layers 17, 18, 19 may comprise a negative doping 12 that is, e.g., in the region of $1\times10^{18}/cm^3$. The layers of the quantum wells, i.e., the quantum films, themselves are undoped. Moreover, a second waveguide layer 210 adjoining the active zone 3 comprises a negative doping 12 that is, e.g., in the region of $1\times10^{18}/cm^3$. The negative doping 12 is constant in the direction away from the active zone 3 to a location near to a boundary region with respect to the second layer 220 and then rises in the form of a negative first peak doping region 13 to a value of $1\times10^{19}/\text{cm}^3$. Afterward, the negative doping 12 in the first peak doping region 13 falls again in the second layer 220 to a value of $1\times10^{18}/\text{cm}^3$.

In the second layer 220, the negative doping 12 remains in the region of the order of magnitude of $1\times10^{18}/\text{cm}^3$. At the end of the second layer 220, before reaching the further second layer 230 the negative doping 12 rises in a second negative peak doping region 14 to a value of $1\times10^{19}/\text{cm}^3$, in order subsequently to fall to a value of $2\times10^{18}$ in the further second layer 230. In the further second layer 230, the negative doping 12 remains constant approximately in the region of $2\times10^{18}/\text{cm}^3$ right into the additional second layer 240. The layers of the second layer arrangement 200 in which, during the operation of the component, the electromagnetic wave comprises an intensity 9 that is above a minimum value are thus lightly doped. Low absorption losses thus rise. Moreover, the heterointerfaces between the layers comprising negative peak doping regions, that is to say doping spikes, are highly doped. A good, i.e., low, forward voltage Uf is thus achieved. Moreover, the electromagnetic wave with the intensity 9 is centered on the active zone 3. Thus a high filling factor is provided and a good laser threshold is achieved.

Figure 16:
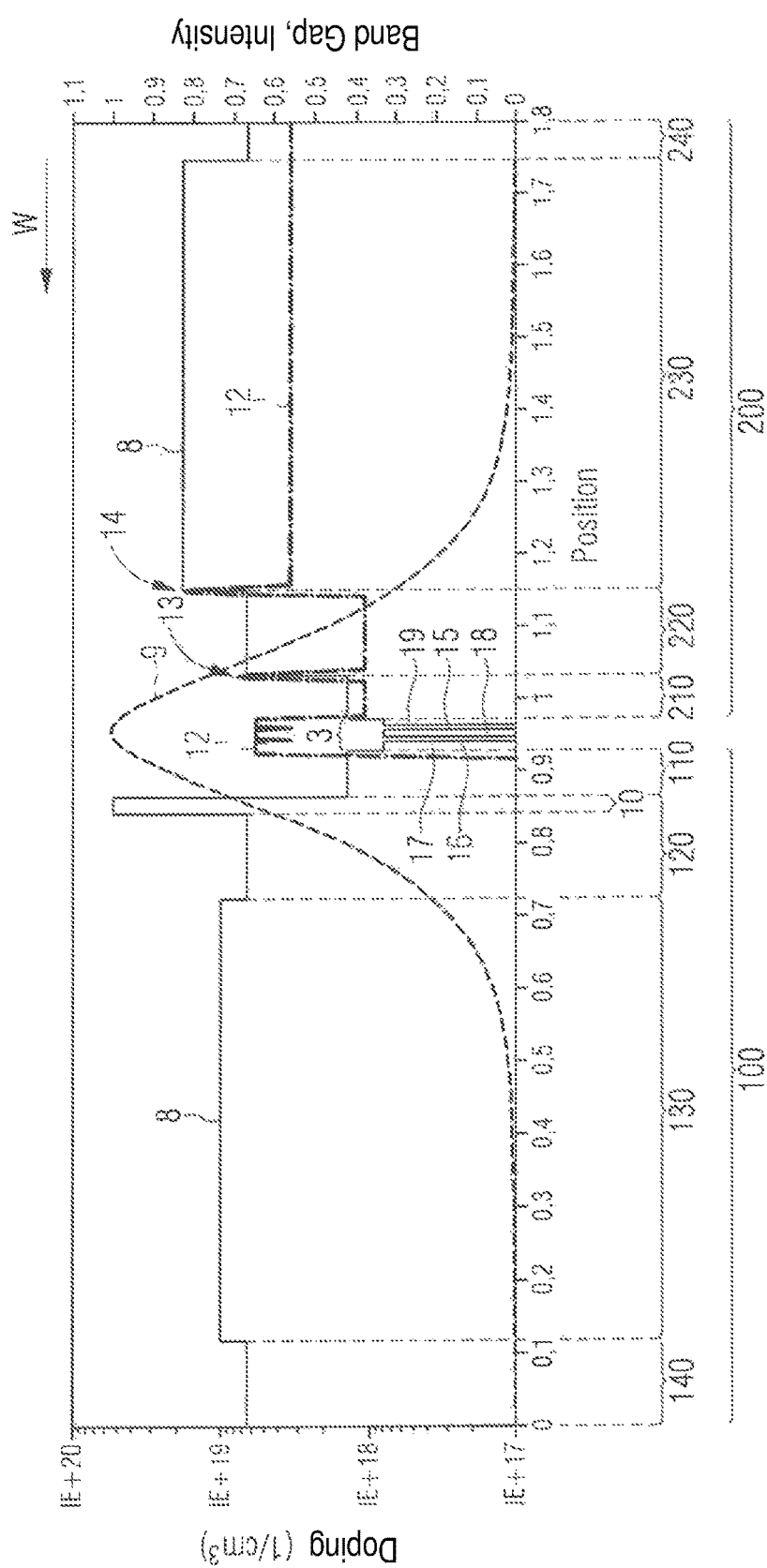

FIG. 16 shows a further embodiment of an electro-optical component corresponding to the embodiment in FIG. 15 in terms of the layer structure. With regard to the negative doping 12, FIG. 16 likewise corresponds to the embodiment in FIG. 15 apart from the active zone 3. In contrast to FIG. 15, the active zone 3 comprises in each case a negative doping 12 in the region of $5\times10^{18}/\text{cm}^3$ in the three barrier layers 17, 18, 19 delimiting the two quantum wells 15, 16. Moreover, the layers of the second layer arrangement 200 are formed in such a way that the negative doping 12 in relation to the intensity 9 of the electromagnetic wave is formed in such a way that a low negative doping 12 of $1\times10^{18}/\text{cm}^3$ or lower is present at an intensity 9 of the electromagnetic wave of greater than 8% of the maximum of the electromagnetic wave.

Figure 17:
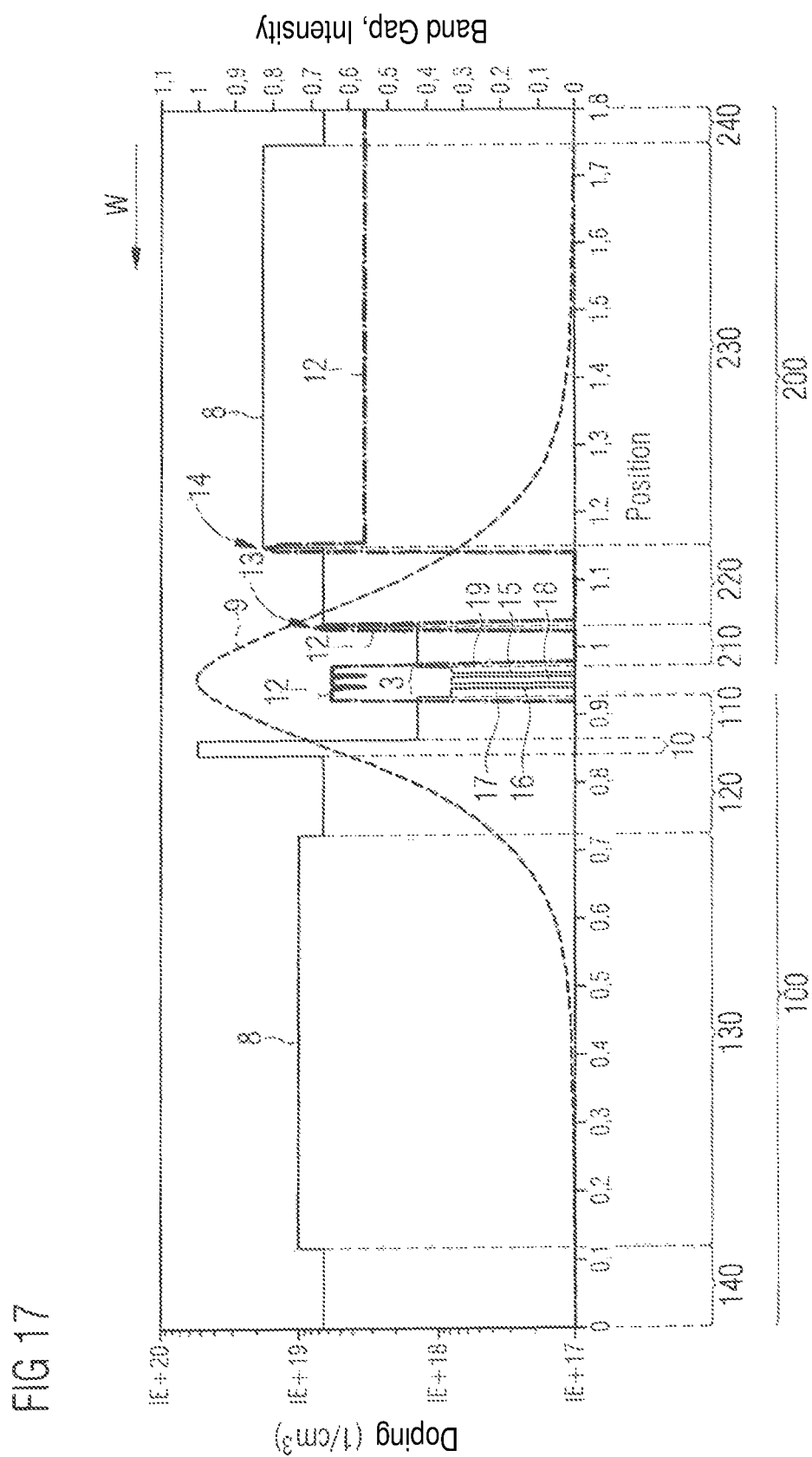

FIG. 17 shows a further embodiment of an optoelectronic component which is identical to the embodiment in FIG. 15 with regard to the layer structure. In contrast to the embodiment in FIG. 16, the second waveguide layer 210 and the second layer 220, apart from the negative first peak doping region 13 and the negative second peak doping region 14, are lightly doped, that is to say that a doping of less than $1\times10^{17}/\text{cm}^3$ or no doping is provided. The barrier layers 17, 18, 19 of the active zone 3 are highly doped in accordance with the embodiment in FIG. 16. A negative first peak doping region 13 is formed in the transition region between the second waveguide layer 210 and the second layer 220, wherein the doping as viewed in the direction away from the active zone 3 begins in the end region of the second waveguide layer 210 and decreases again after exceeding the maximum value in the initial region of the second layer 220. The negative doping 12 in the transition region between the second layer 220 and the further second layer 230 is formed in the same way. In this case, the negative doping likewise rises in the end region of the second layer 220 from a value of less than $1\times10^{17}/\text{cm}^3$ up to a value of $1\times10^{19}/\text{cm}^3$ and then decreases to a value of $3\times10^{18}/\text{cm}^3$ in the further second layer 230. The negative doping 12 remains constant in the region of $3\times10^{18}$ in the region of the further second layer 230. Likewise in the region of the additional second layer 240.

Figure 18:
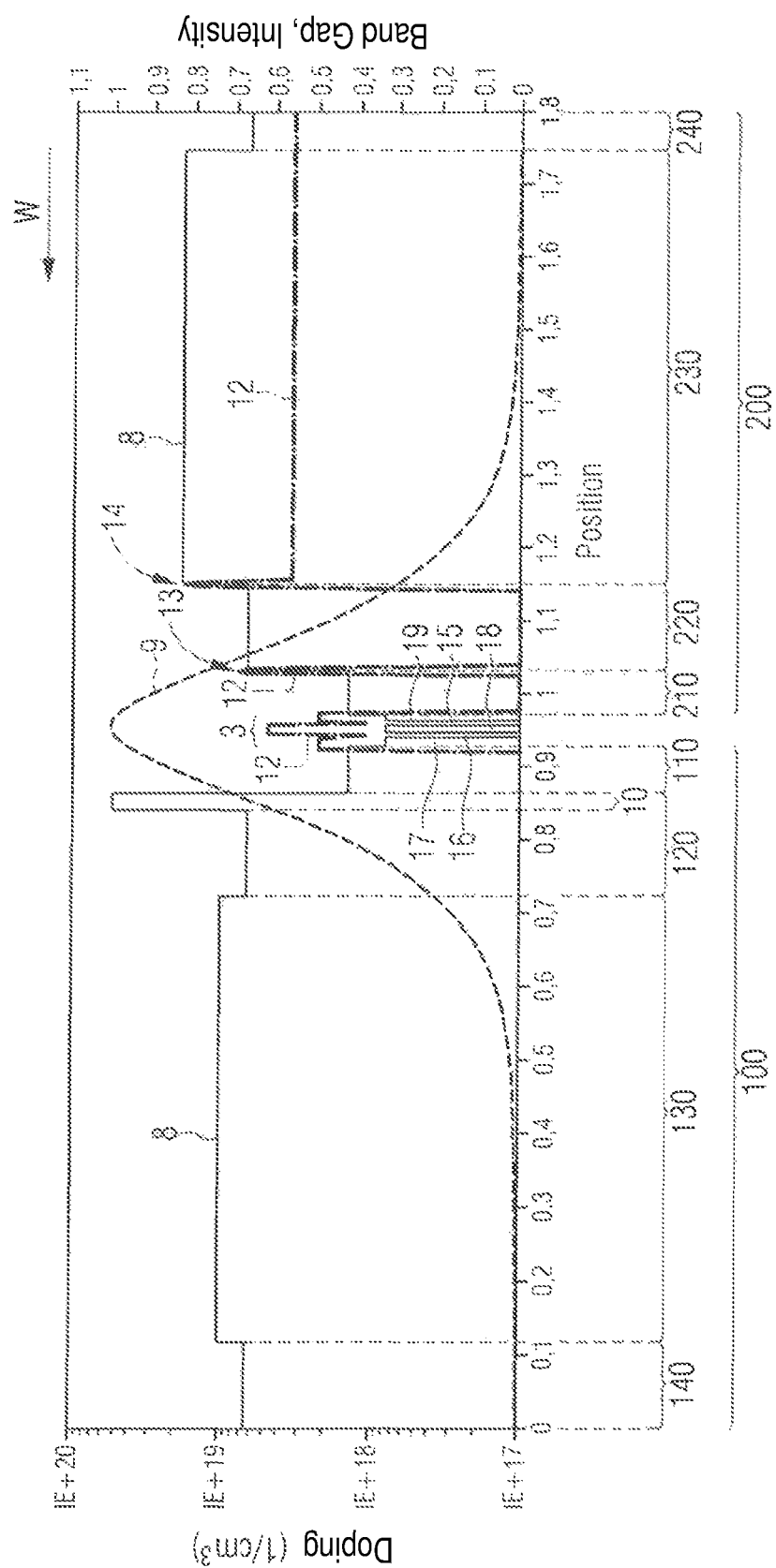

FIG. 18 shows a further embodiment, in which the optoelectronic component comprises the same layer structure as in FIG. 15. In the embodiment illustrated, the active zone 3 comprises two quantum wells 15, 16 delimited respectively by a barrier layer 17, 18, 19. The central barrier layer 18 comprises a negative doping 12 that is in the region of $3\times10^{18}/\text{cm}^3$. The two outer barrier layers 17, 19 comprise a negative doping 12 that is in the region of $2\times10^{18}/\text{cm}^3$. The second waveguide layer 210 is lightly doped, that is to say that a negative doping that is less than $1\times10^{17}$ is provided. Furthermore, a negative first peak doping region 13 is provided in the transition between the second waveguide layer 210 and the second layer 220. The first negative peak doping region 13 comprises a larger width in comparison with the embodiment in FIG. 17. The negative doping may extend into the second waveguide layer 210 and into the second layer 220 by up to 10 nm, 20 nm or even 30 nm or more. It is ensured in this way that a sufficiently high doping is present in the boundary region between the second waveguide layer 210 and the second layer 220. The negative second peak doping region 14 is formed in the same way, such that the negative doping extends over a depth of 10 nm, 20 nm or up to 30 nm or more into the end region of the second layer 220 and into the initial region of the further second layer 230. The doping remains constant in the region of $3\times10^{18}$ in the further second layer 230. Likewise in the additional second layer 240.

A low forward voltage Uf is achieved by the configuration of the doping profile in the form of a ramp comprising corresponding widths. Moreover, the central barrier layer 18 of the active zone 3 between the quantum wells is more highly doped. Improved injection is achieved as a result.

Figure 19:
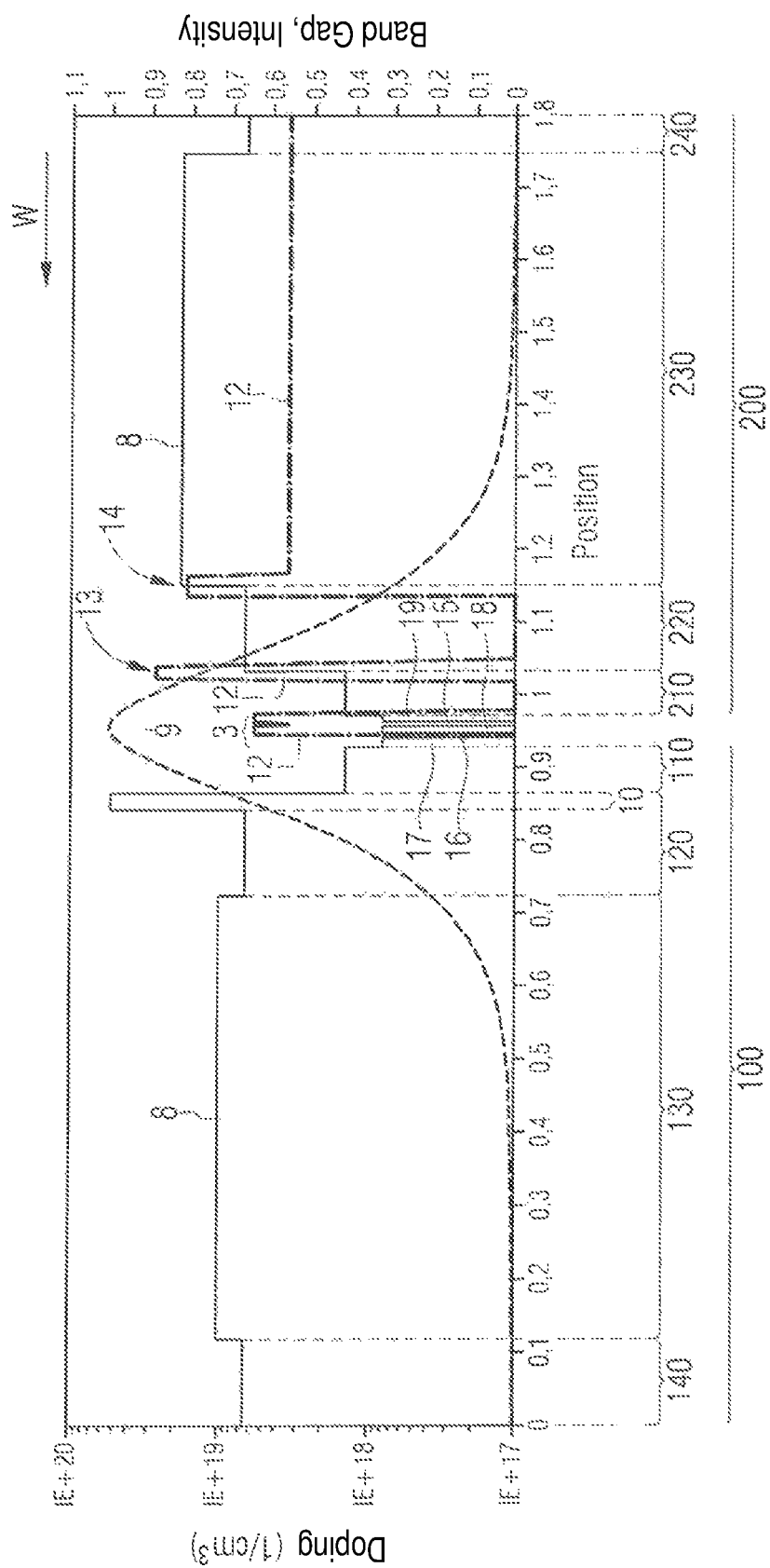

FIG. 19 shows a further embodiment of an optoelectronic component, the layers of which are configured in accordance with the component in FIG. 15. Moreover, the second layer arrangement 200 comprises a negative first peak doping region 13 and a negative second peak doping region 14. In contrast to the embodiment in FIG. 18, the negative first peak doping region 13 is formed such that it is wider. The negative peak doping region 13 may comprise a width of 20 nm, 40 nm, 60 nm or more. In this case, the negative first peak doping region 13 may be arranged in equal portions in the second waveguide layer 210 and the second layer 220. Moreover, the first negative peak doping region 13 comprises a doping in the region of $2\times10^{19}/\text{cm}^3$. The second waveguide layer 210 is virtually undoped outside the first peak doping region 13, that is to say that the doping is at or below $1\times10^{17}/\text{cm}^3$. Likewise, the negative second peak doping region 14 comprises a width of 20 nm, 40 nm, 60 nm or more. The negative second peak doping region 14 is preferably formed in equal portions in the second layer 220 and in the further second layer 230. In the embodiment illustrated, the second negative peak doping region 14 comprises a doping in the region of $1\times10^{19}/\text{cm}^3$.

In the exemplary embodiment illustrated, the active zone 3 comprises two quantum wells 15, 16 delimited by three barrier layers 17, 18, 19. Here the third barrier layer 19 and the second barrier layer 18 in each case comprise a negative doping that is in the region of $5\times10^{18}/\text{cm}^3$. The first barrier layer 17 adjoining the first layer arrangement 100 is substantially undoped, that is to say that the first barrier layer 17 comprises a doping that is less than $1\times10^{17}/\text{cm}^3$.

Low absorption losses of the electromagnetic wave are achieved with this embodiment, too. Moreover, good values for the forward voltage Uf are achieved on account of the wide configuration of the negative first and second peak doping regions 13, 14. Good injection into the active zone is made possible by the high doping of the barrier layers 18, 19.

Figure 20:
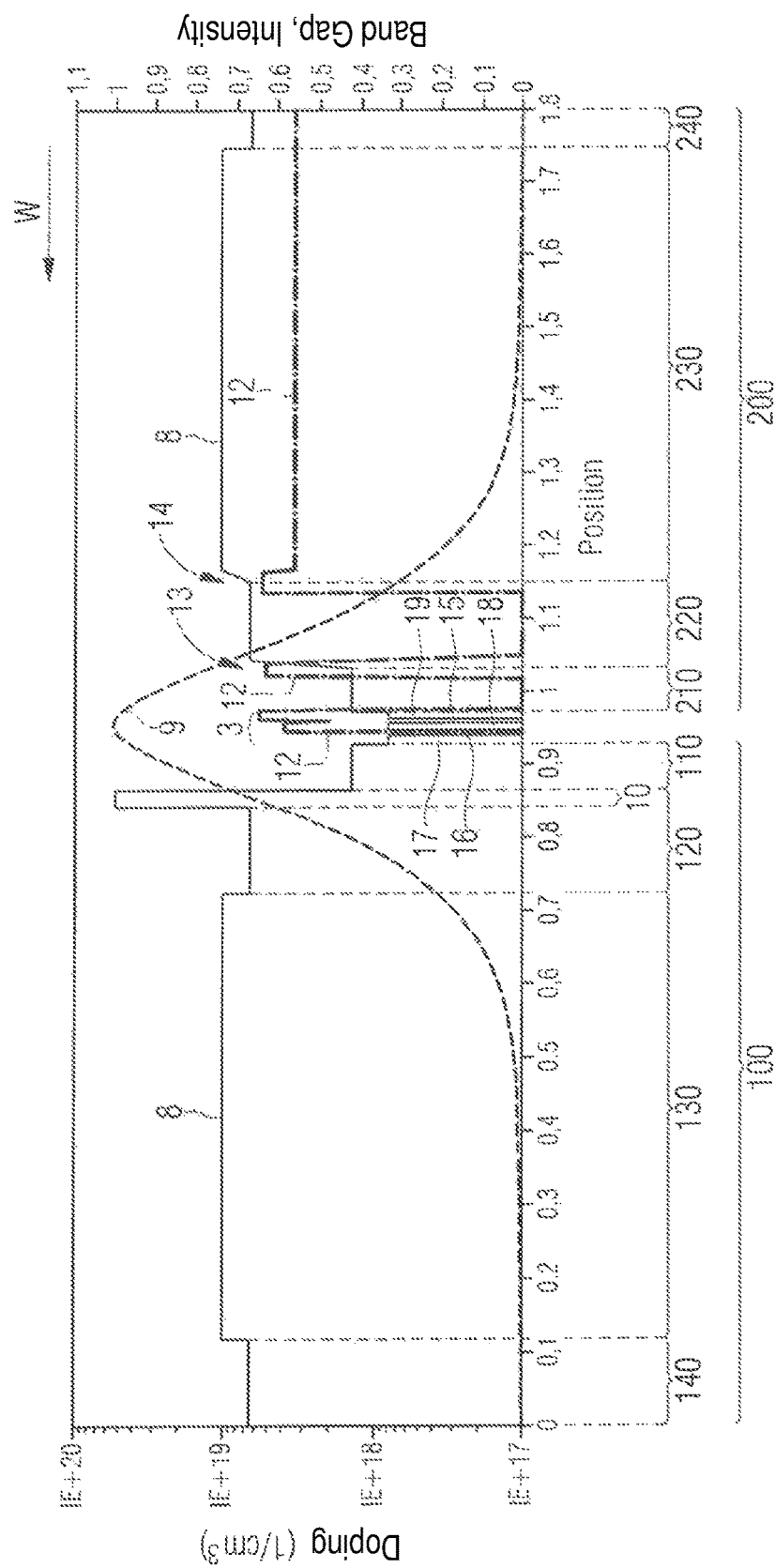

FIG. 20 shows a further embodiment, which substantially corresponds to the layer structure of the embodiment in FIG. 15, but wherein the material composition changes continuously in the transition region between the active zone 3 and the second waveguide layer 210 and between the second waveguide layer 210 and the second layer 220 and the second layer 220 and the further second layer 230, such that the band gap 8 in the transition region is configured in the form of a ramp. Furthermore, the third barrier layer 19 formed between the second waveguide layer 210 and the second quantum well 16 comprises a negative doping that is in the region of $5\times10^{18}/cm^3$. The second barrier layer arranged between a first quantum well 15 and the second quantum well 16 comprises a negative doping that is in the region of $4\times10^{18}/cm^3$. The first barrier layer 17 arranged between the first quantum well 15 and the first layer arrangement 100 comprises substantially a low negative doping below $1\times10^{17}/cm^3$ or no doping.

The negative first and second peak doping regions 13, 14 are arranged in each case in the transition region between the second waveguide layer 210 and the second layer 220 and, respectively, between the second layer 220 and the further second layer 230. The negative first and second peak doping regions 13, 14 are thus located in the ramp region of the layer transitions. Preferably, the peak doping regions 13, 14 are at least as wide as the ramps and begin and end in the respective adjoining layers. The negative first and second peak doping regions 13, 14 preferably comprise a width of 20 nm, 40 nm or 60 nm or more. The first and second negative peak doping regions 13, 14 comprise a doping that is in the region of $5\times10^{18}/cm^3$. Outside the first peak doping region 13, the second waveguide layer 210 is substantially undoped, that is to say that the doping is less than $1\times10^{17}$. Moreover, the second layer 220 in the region outside the first and second peak doping regions 13, 14 is substantially negatively undoped, that is to say that the doping lies in the range of less than $1\times10^{17}/cm^3$. The further second layer 230 and the adjoining additional second layer 240 comprise a negative doping that is in the region of $3\times10^{18}/cm^3$.

A low forward voltage Uf is achieved by the configuration of the heterointerfaces between the individual layers in the form of ramps with regard to the material composition and the associated band gap rising or falling in a ramplike manner.

Figure 21:
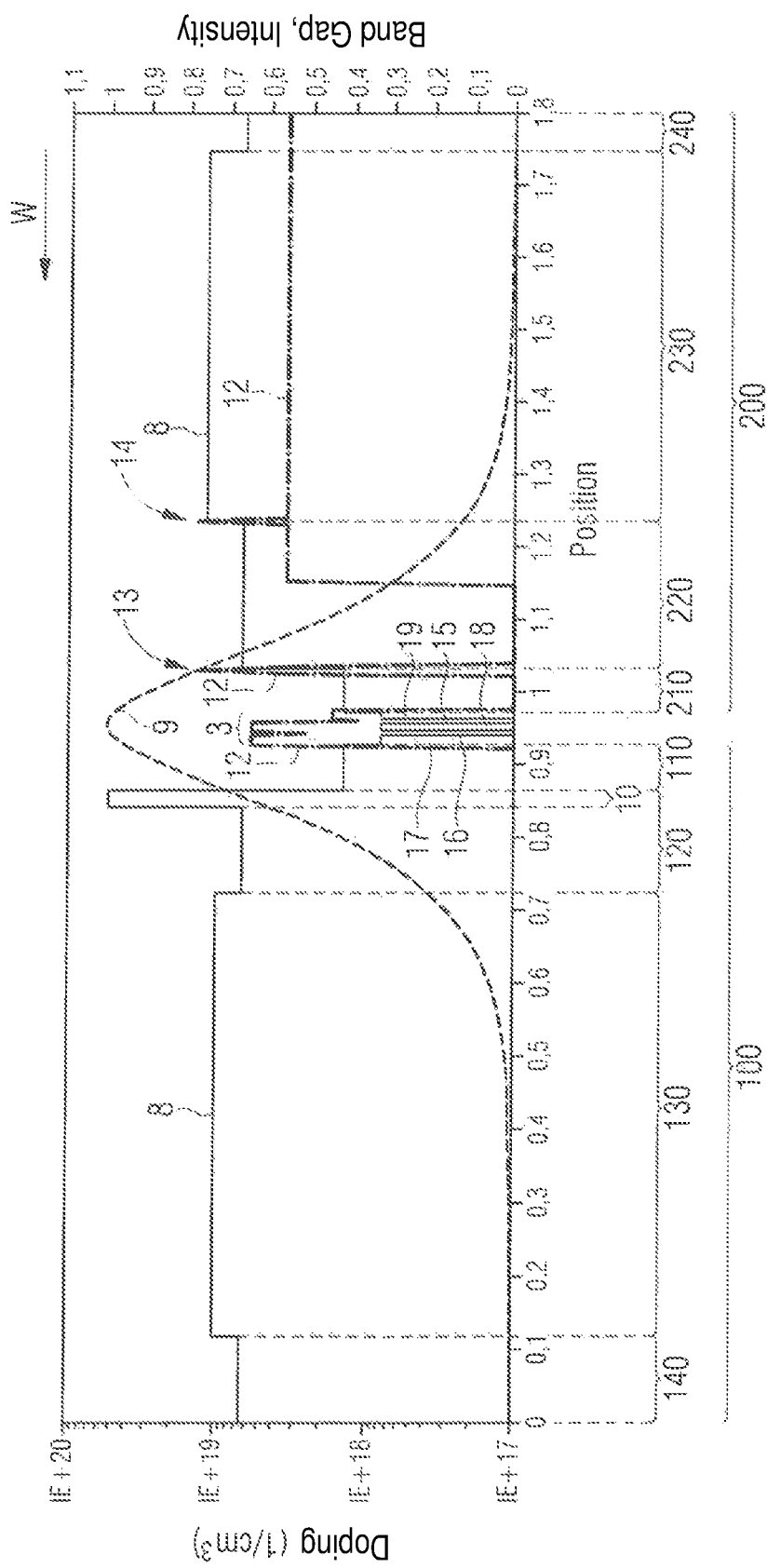

FIG. 21 shows a further embodiment, the layer structure of which corresponds to FIG. 15. Moreover, the negative doping 12 in the transition region between the second waveguide layer 210 and the second layer 220 comprises a negative first peak doping region 13 configured in the form of a relatively wide peak configured in accordance with the negative first peak doping region 13 in FIG. 18. In this case, the width may be in the region of 20 nm, 40 nm, 60 nm or more. The second waveguide layer 210 outside the negative first peak doping region 13 is substantially undoped, that is to say that the doping is less than $1\times10^{17}/cm^3$. Approximately in the center of the layer thickness of the second layer 220, the doping rises from a value of less than $1\times10^{17}/cm^3$ to a value of $3\times10^{18}/cm^3$ and remains substantially constant in the direction of the further second layer 230 until shortly before reaching the end of the second layer 220, as viewed away from the active zone 3, the negative second peak doping region 14 is formed. The second peak doping region 14 is formed such that it is narrower in width than the negative first peak doping region 13. The width of the negative second peak doping region 14 may be, e.g., less than 30 nm, in particular less than 20 nm.

The negative first peak doping region 13 comprises a peak doping of $2\times10^{19}/cm^3$. The negative second peak doping region 14 comprises a doping in the region of $1.5\times10^{19}/cm^3$. Within the further second layer 230, the negative doping 12 falls after the negative second peak doping region 14 to a value of $4\times10^{18}/cm^3$. In the transition from the further second layer 230 to the additional second layer 240, the doping is reduced to a value of $1\times10^{18}$.

The active zone 3 comprises a third barrier layer 19 comprising a doping in the region of $1\times10^{18}$. The third barrier layer 19 adjoins the second waveguide layer 210. The second barrier layer 18 arranged between the two quantum wells comprises a negative doping 12 that is in the region of $8\times10^{18}/cm^3$. The first barrier layer 17 adjoining the first layer arrangement 100 likewise comprises a negative doping 12 that is in the region of $8\times10^{18}/cm^3$. The two quantum wells 15, 16 arranged between the three barrier layers 17, 18, 19 are substantially undoped, that is to say that the doping is less than $1\times10^{17}/cm^3$.

The optoelectronic component is configured in such a way that, apart from the active zone and the negative first peak doping region 13, the layers in which an intensity of greater than 23% of the maximum intensity of the electromagnetic wave is arranged are substantially undoped. Low internal absorption losses are achieved as a result. Moreover, a part of the second layer 220, which is configured as a waveguide, is doped for a better forward voltage Uf. Moreover, the heterointerfaces are provided with the peak doping regions. A good Uf is achieved as a result.

Figure 22:
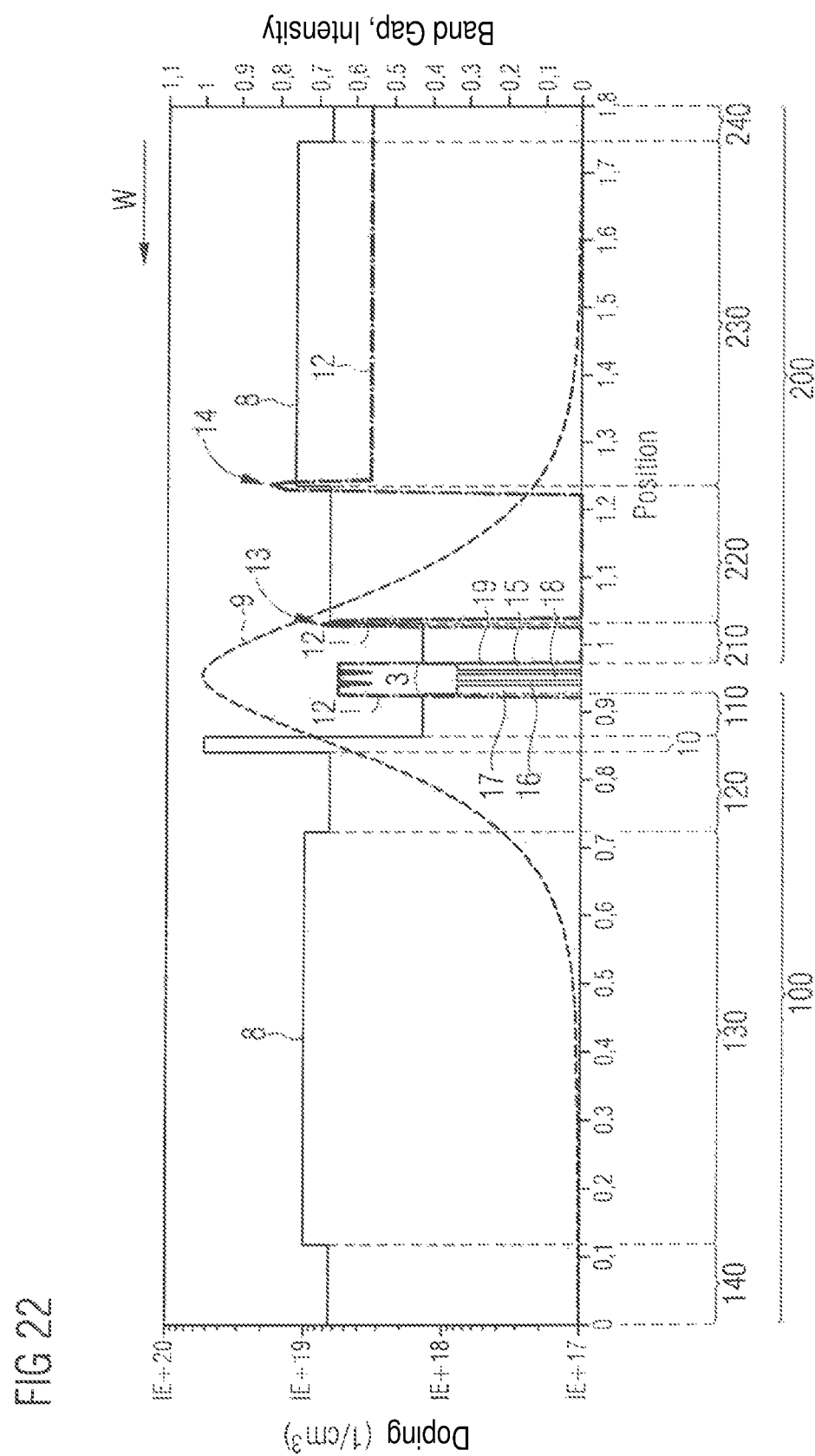

FIG. 22 shows a configuration of an optoelectronic component which is constructed substantially in accordance with FIG. 16, but wherein, in comparison with the configuration in FIG. 16, the second waveguide layer 210 is configured such that it is significantly wider than the first waveguide layer 110. In this way, the electromagnetic wave is shifted in the direction of the n-side, that is to say in the direction of the second layer arrangement 200. A further reduction of the internal absorption losses is achieved as a result. The shift of the optical wave may be achieved, for example, by a reduction of the indium concentration or by an increase in the aluminum concentration in the second layer arrangement 200 or by a corresponding wider thickness of the second waveguide on the n-side, i.e., in the second layer arrangement 200.

Otherwise a negative peak doping region 13, 14 is in each case provided at the transitions of the layers or at the edges of the interfaces.

The different layer structures of the first layer arrangement 100 and the dopings thereof as illustrated in FIGS. 5 to 14 may be combined with the different layer structures of the second layer arrangements 200 in FIGS. 15 to 22 and the layer arrangements thereof. Individual sections of the first layer arrangements 100 in FIGS. 5 to 14 may also be combined with sections of the second layer arrangements 200 in FIGS. 15 to 22.

The values for the band gaps or the dopings as indicated in the figures are examples that lead to good results. The illustrated or the described values for the doping and/or for the band gaps may deviate therefrom and deviate in particular by +/−30%.

The values for the dopings and/or the band gaps and/or the layer materials as explained with reference to FIGS. 5 to 22 may be applied correspondingly in the case of FIGS. 1 to 4.

Depending on the chosen embodiments of the components, the layer structures of the first layer arrangement 100 and the positive doping profiles 5 in FIGS. 5 to 14 may be combined with the different layer structures in FIGS. 15 to 22 the different negative doping profiles 14 thereof. Moreover, the illustrated examples for the negative doping 12 of the active zone 3 in FIGS. 15 to 22 may also be combined with different negative doping profiles 12 in FIGS. 15 to 22 and with the layer structures of the first layer arrangements 100 and the positive doping profiles 5 thereof in FIGS. 5 to 14.

For the positive doping, by way of example, magnesium, carbon, beryllium, zinc, cadmium and/or calcium may be used as dopant. The arrangement described is suitable, in particular, for the material system aluminum gallium indium nitride, which constitutes a piezoelectric material. Particularly at heterointerfaces between materials comprising different aluminum and/or indium contents, a voltage drop may occur on account of the piezoelectric effects. Therefore, it is advantageous to provide a positive peak doping region at transitions from a small band gap to a larger band gap, that is to say, for example, from gallium nitride to aluminum gallium nitride, from indium gallium nitride to gallium nitride, from indium gallium nitride to aluminum gallium nitride or from aluminum gallium nitride to aluminum gallium nitride comprising a higher aluminum concentration. This holds true, in particular, for growth on a gallium face of gallium nitride. In the case of growth on the nitrogen-terminated face of gallium nitride, the transitions from a larger band gap to a smaller band gap are doped. In this case, the materials may be binary (gallium nitride, aluminum nitride), ternary (aluminum gallium nitride, indium gallium nitride) or quaternary (aluminum indium gallium nitride).

Bulk regions between the heterointerfaces here preferably remain lightly doped in order to reduce or to avoid an absorption of the electromagnetic radiation. The doping here is preferably reduced only in the regions in which the intensity 9 of the optical wave is above a minimum limit. The height of the doping regions may likewise be limited to a maximum value in order to limit or to avoid the absorption of the electromagnetic wave. The doping here is preferably reduced in the regions in which the intensity of the optical wave is greater than a minimum value. The height of the doping in the peak doping regions in regions even without intensity of the electromagnetic wave may be chosen to be smaller than in the regions of a low intensity of the electromagnetic wave. Absorption losses may furthermore be reduced as a result.

Moreover, in regions of low positive doping the aluminum content may be decreased and the band gap and the activation energy may thus be reduced in order to increase the conductivity.

The optical wave is preferably centered on the active zone, such that a better filling factor is achieved, or guided on the n-side, such that less absorption occurs. In the last-mentioned case, the maximum of the optical wave thus preferably lies between the active zone and the n-type contact, i.e., the second layer arrangement 200. The laser threshold and, in particular, the slope of the laser characteristic curve and thus the efficiency of the laser diode are improved as a result of the reduction of the internal losses. As a result, higher output powers and longer lifetimes are possible or the optoelectronic component may be operated at higher temperatures. What is achieved by introducing the peak doping regions is that the forward voltage Uf of the laser diode is low and a good efficiency is thus achieved.

The positive dopings or the positive peak doping regions may comprise one or more positive dopants. The doping may be greater than $1 \times 10^{18}/cm^3$, preferably greater than $5 \times 10^{18}/cm^3$, particularly preferably $8 \times 10^{18}/cm^3$, and in particular greater than $1 \times 10^{19}/cm^3$.

By way of example, primarily the regions of the layers in which the intensity 9 of the optical wave relative to the maximum is greater than a minimum value are lightly doped. The minimum values may constitute 40%, 15% or 3% of the maximum. Lightly doped may mean that the dopant concentration is less than $2 \times 10^{19}/cm^3$, preferably less than $8 \times 10^{18}/cm^3$, particularly preferably less than $4 \times 10^{18}/cm^3$. The regions—facing away from the active zone—of the layers in which the intensity is less than the figure mentioned above may be doped with a dopant concentration of greater than $5 \times 10^{18}/cm^3$, preferably greater than $1 \times 10^{19}/cm^3$. Besides a constant doping, by way of example, it is also possible to provide a progressive rise in the positive doping in a manner corresponding to the decrease in the intensity of the wave, that is to say that the doping may increase with greater distance from the active zone 3.

In addition or instead of the corresponding positive doping as described, the negative doping of the n-side may also be chosen correspondingly. The advantages described are achieved in the case of the material system aluminum gallium indium nitride, for example, since aluminum gallium indium nitride constitutes a piezoelectric material which may comprise an increased voltage drop in particular at heterointerfaces between materials comprising different aluminum and/or indium contents on account of the piezoelectric properties. Therefore, it may be advantageous to provide the transitions from a larger band gap to a smaller band gap, for example, from gallium nitride to indium gallium nitride, or from aluminum gallium nitride to gallium nitride, or from indium gallium nitride to indium gallium nitride comprising a higher indium concentration, with a negative peak doping region. This holds true, for example, for growth on the gallium-terminated surface of gallium nitride. In the case of growth on the nitrogen-terminated face of gallium nitride, the transitions from a smaller band gap to a higher band gap are doped. In this case, the materials may be binary (gallium nitride, aluminum nitride), ternary (aluminum gallium nitride, indium gallium nitride) or quaternary (aluminum indium gallium nitride).

Bulk regions between the heterointerfaces here may be lightly doped or nominally undoped. The doping here is preferably reduced in the regions in which the intensity of the optical wave is greater than a predefined minimum value. One or more of the barrier layers of the active zone which are arranged upstream of, downstream of, or between, the quantum wells may be negatively doped at least in part. Moreover, the optical wave may be guided on the n-side, for example, such that the maximum of the optical wave is preferably arranged between the active zone and the n-type contact.

By reducing the doping in the regions in which the optical wave comprises a significant intensity, the internal losses in the optoelectronic component are reduced, particularly in the case of a laser. As a result, a laser threshold is improved and, in particular, the slope of the laser characteristic curve and thus the efficiency of the laser diode are increased. As a result, higher output powers and longer lifetimes are possible or the electro-optical component may be operated at higher temperatures. Values for the doping of the negative peak doping regions may be chosen in the range of greater than $5 \times 10^{17}/cm^3$, preferably greater than $1 \times 10^{18}/cm^3$, in particular preferably greater than $2 \times 10^{18}/cm^3$ and preferably greater than $5 \times 10^{18}/cm^3$. By way of example, silicon, oxygen or germanium may be used as negative dopants.

The regions of the n-side which face away from the active zone and in which the intensity are less than the predefined maxima are doped, for example, with a dopant concentration of greater than $5 \times 10^{17}/cm^3$, preferably greater than $1 \times 10^{18}/cm^3$. The dopant concentrations in the active zone or in the barrier layers of the active zone are, for example, greater than $5 \times 10^{17}/cm^3$, preferably greater than $1 \times 10^{18}/cm^3$, preferably greater than $2 \times 10^{18}/cm^3$, and in particular preferably greater than $5 \times 10^{18}/cm^3$. Preferably, on the n-side a doping in the range of 3 to $6 \times 10^{18}/cm^3$ may be provided outside the negative peak doping regions.

The optoelectronic component in FIGS. 1 to 22 is configured, for example, as a laser, in particular as a laser diode or as a stripe laser or as a light emitting diode (LED).

The arrangements explained with reference to the figures are suitable for layers and layer arrangements composed of binary, ternary and/or quaternary III-V or II-VI compound semiconductor materials, wherein the layers were grown in such a way that the layers comprise a surface terminated with a group III or II element, wherein the group III element is from the group Al, In or Ga and the group II element is from the group Zn, Mg or Cd, and wherein the two layers are arranged on a p-side in relation to the active zone, and wherein a transition from a smaller band gap to a larger band gap is provided between the two layers as viewed in a growth direction of the layers, and wherein the peak doping region is positively doped at the interface.

Moreover, the arrangements explained with reference to the figures are suitable for layers and layer arrangements composed of binary, ternary and/or quaternary III-V II-VI compound semiconductor materials, wherein the layers were deposited in such a way that the layers comprise a surface terminated with a group III or II element, wherein the group III element is from the group Al, In or Ga and the group II element is from the group Zn, Mg or Cd, and wherein the two layers are arranged on a n-side in relation to the active zone, and wherein a transition from a larger band gap to a smaller band gap is provided between the two layers as viewed in a growth direction of the layers, and wherein the peak doping region is negatively doped at the interface.

Furthermore, the arrangements described with reference to the figures are suitable for layers and layer arrangements composed of binary, ternary and/or quaternary III-V or II-VI compound semiconductor materials, wherein the layers of the compound semiconductor material were grown in such a way that the layers comprise a surface terminated with a group V or VI element, wherein the group V element is from the group N, As or Sb and the group VI element is oxygen, wherein the two layers are arranged on a p-side in relation to the active zone, wherein a transition from a larger band gap to a smaller band gap is provided between the two layers as viewed in a growth direction of the layers, and wherein the peak doping region is positively doped at the interface.

Furthermore, the arrangements described with reference to the figures are suitable for layers and layer arrangements composed of binary, ternary and/or quaternary III-V or II-VI compound semiconductor materials, wherein the layers of the compound semiconductor material were grown in such a way that the layers comprise a surface terminated with a group V element or with a group VI element, wherein the group V element is from the group N, As or Sb and the group VI element is oxygen, wherein the two layers are arranged on a n-side in relation to the active zone, wherein a transition from a smaller band gap to a larger band gap is provided between the two layers as viewed in a growth direction of the layers, and wherein the peak doping region is negatively doped at the interface. The growth direction of the layers may be parallel to the c-axis of the lattice structure, but may also deviate therefrom, e.g., by $\pm 20°$ or more. The greater the deviation from the c-axis, the smaller the polarization field formed at the interface between the layers. In the case of a deviation by 90° from the orientation of the c-axis, the polarization field is equal to 0.

Moreover, the arrangements described with reference to the figures are suitable for layers and layer arrangements composed of II-VI compound semiconductor materials, in particular zinc oxide and/or or magnesium zinc oxide, wherein an electrical voltage drop occurs at the interface of two layers on account of a polarization field caused by the different construction of the layers. At these interfaces, too, the voltage drop may be at least attenuated with the aid of the peak doping regions.

FIG. 23 shows a wurtzite structure of a III-V or II-VI compound semiconductor material in a schematic illustration. The structure is constructed from atoms of two elements. The atoms of the two different elements 300, 400 are illustrated in one instance as a circle 300 and in one instance as a double circle 400 in the figure. The two elements 300, 400 are constituted by elements of groups III and V or by the elements of groups II and VI in the case of III-V or II-VI compound semiconductor materials, respectively. The wurtzite structure illustrated is terminated by the elements with the double circle 400. The C-axis is additionally illustrated, running perpendicularly to the 0001 plane.

Depending on the configuration, the positions of the double circles 400 in the case of a III-V compound semiconductor material may be occupied by the atoms of the group III elements or the atoms of the group V elements. Consequently, the wurtzite structure may be terminated by a group III element or a group V element.

Depending on the configuration, the positions of the double circles 400 in the case of a II-VI compound semiconductor material may be occupied by the atoms of the group II elements or the atoms of the group VI elements. Consequently, the wurtzite structure may be terminated by a group II element or a group VI element.

Although the invention has been more specifically illustrated and described in detail by means of the preferred exemplary embodiment, nevertheless the invention is not restricted by the examples disclosed and other variations may be derived therefrom by the person skilled in the art, without departing from the scope of protection of the invention.

The invention claimed is:

1. An optoelectronic component comprising:
   an active zone for generating electromagnetic radiation, wherein the active zone adjoins at least one first layer arrangement composed of a semiconducting material, wherein the first layer arrangement comprises at least two layers, wherein the two layers are formed in such a way that a piezoelectric field is generated at an interface between the two layers, the piezoelectric field being configured to provide an electrical voltage drop at the interface,
   wherein a peak doping region is provided at the interface of the two layers in order to reduce the electrical voltage drop, wherein a doping of the peak doping region in a direction away from the active zone rises at least by a first percentage value and then falls by at least a second percentage value, wherein the first and second percentage values are greater than 10% of a maximum doping of the peak doping region,
   wherein the active zone comprises at least one quantum well layer arranged between two barrier layers, wherein at least one of the barrier layers is negatively doped, and wherein the negative doping is greater than $5 \times 10^{17}/\text{cm}^3$.

2. The component according to claim 1, wherein the semiconducting material constitutes a binary, ternary and/or quaternary III-V or II-VI compound semiconductor material, wherein the semiconducting material was grown with a surface terminated with a group III or group II element, wherein the group III element is an element from the group consisting of Al, In and Ga, wherein the group II element is an element from the group consisting of Zn, Mg and Cd, wherein the two layers are arranged on a p-side in relation to the active zone, wherein a transition from a smaller band gap to a larger band gap is provided between the two layers as viewed in a growth direction of the layers, and wherein the peak doping region is positively doped, or wherein the semiconducting material constitutes a binary, ternary and/or quaternary III-V or II-VI compound semiconductor material, wherein the semiconducting material was grown with a surface terminated with a group III or group II element, wherein the group III element is an element from the group consisting of Al, In and Ga, wherein the group II element is an element from the group consisting of Zn, Mg and Cd, wherein the two layers are arranged on a n-side in relation to the active zone, wherein a transition from a larger band gap to a smaller band gap is provided between the two layers as viewed in a growth direction of the layers, and wherein the peak doping region is negatively doped, or wherein the semiconducting material constitutes a binary, ternary and/or quaternary III-V or II-VI compound semiconductor material, wherein the semiconducting material was grown with a surface terminated with a group V or group VI element, wherein the group V element is an element from the group consisting of N, As and Sb, wherein the group VI element is O, wherein the two layers are arranged on a p-side in relation to the active zone, wherein a transition from a larger band gap to a smaller band gap is provided between the two layers as viewed in a growth direction of the layers, and wherein the peak doping region is positively doped, or wherein the semiconducting material constitutes a binary, ternary and/or quaternary III-V or II-VI compound semiconductor material, wherein the semiconducting material was grown with a surface terminated with a group V or group VI element, wherein the group V element is an element from the group consisting of N, As and Sb, wherein the group VI element is O, wherein the two layers are arranged on a n-side in relation to the active zone, wherein a transition from a smaller band gap to a larger band gap is provided between the two layers as viewed in a growth direction of the layers, and wherein the peak doping region is negatively doped.

3. The component according to claim 1, wherein the active zone comprises at least one quantum well layer arranged between the two barrier layers, wherein at least one of the barrier layers is negatively doped, wherein the negative doping is greater than $1 \times 10^{18}/\text{cm}^3$, or wherein the active zone comprises a plurality of quantum wells, wherein each quantum well is arranged between two barrier layers, wherein, proceeding from a second layer arrangement, first two barrier layers of the first two quantum wells are negatively doped, and wherein the at least one following barrier layer is undoped.

4. The component according to claim 1, wherein the peak doping region comprises a width which perpendicular to a plane of the active zone is in a range of between 1 nm and 100 nm.

5. The component according to claim 1, wherein the peak doping region is formed in both layers adjoining one another.

6. The component according to claim 1, wherein a rise in the doping in the peak doping region and/or a decrease in the doping in the peak doping region comprises a ramp.

7. The component according to claim 1, wherein the first layer arrangement comprises a positively doped blocking layer for electrons, wherein the blocking layer adjoins the active zone or is arranged between a first waveguide layer and the first layer arrangement, and wherein adjoining an interface of the blocking layer a peak doping region is formed in order to reduce a voltage drop.

8. The component according to claim 1, wherein the layers between which the interface is formed comprise a II-VI compound semiconductor material.

9. An optoelectronic component comprising:
an active zone for generating electromagnetic radiation, wherein the active zone adjoins at least one first layer arrangement composed of a semiconducting material, wherein the first layer arrangement comprises at least two layers, wherein the two layers are formed in such a way that a piezoelectric field is generated at an interface between the two layers, the piezoelectric field being configured to provide an electrical voltage drop at the interface, wherein a peak doping region is provided at the interface of the two layers in order to reduce the electrical voltage drop, wherein a doping of the peak doping region in a direction away from the active zone rises at least by a first percentage value and then falls by at least a second percentage value, wherein the first and second percentage values are greater than 10% of a maximum doping of the peak doping region, wherein the active zone comprises at least one quantum well layer arranged between two barrier layers, wherein at least one of the barrier layers is negatively doped, and wherein the negative doping is greater than $5 \times 10^{17}/\text{cm}^3$, wherein the first layer arrangement comprises as layers at least one first waveguide layer and a first layer, wherein the first waveguide layer is arranged between the active zone and the first layer, and wherein a peak doping region is provided at an interface between the first waveguide layer and the first layer, wherein adjoining the first layer a further first layer is provided, wherein the first layer and the further first layer are formed in such a way that a piezoelectric field is generated at an interface between the first layer and the further first layer, the piezoelectric field being configured to provide an electrical voltage drop at the interface of the first layer and the further first layer, wherein a second peak doping region is provided at the interface of the first layer and the further first layer in order to reduce the electrical voltage drop, wherein a doping of the second peak doping region in a direction away from the active zone rises at least by a first percentage value and then falls by at least a second percentage value, and wherein the first and second percentage values are greater than 10% of the doping of the layer which is arranged nearer to the active zone.

10. An optoelectronic component comprising:
an active zone for generating electromagnetic radiation, wherein the active zone adjoins at least one first layer arrangement composed of a semiconducting material, wherein the first layer arrangement comprises at least two layers, wherein the two layers are formed in such a way that a piezoelectric field is generated at an interface between the two layers, the piezoelectric field being configured to provide an electrical voltage drop at the interface, wherein a first peak doping region is provided at the interface of the two layers in order to reduce the electrical voltage drop, wherein a doping of the first peak doping region in a direction away from the active zone rises at least by a first percentage value and then falls by at least a second percentage value, wherein the first and second percentage values are greater than 10% of a maximum doping of the first peak doping region, wherein the active zone comprises at least one quantum well layer arranged between two barrier layers, wherein at least one of the barrier layers is negatively doped, wherein the negative doping is greater than $5 \times 10^{17}/cm^3$, wherein the active zone is arranged between the first layer arrangement and a second layer arrangement comprised of a semiconducting material, wherein the second layer arrangement comprises as further two layers at least one second waveguide layer and a second layer, wherein the second waveguide layer is arranged between the active zone and the second layer, wherein the further two layers are formed in such a way that a piezoelectric field is generated at an interface between the further two layers, the piezoelectric field being configured to provide a voltage drop at the interface of the further two layers, wherein a second peak doping region is provided at the interface of the further two layers in order to reduce the voltage drop, wherein a doping of the second peak doping region in a direction away from the active zone rises at least by a first percentage value and then falls by at least a second percentage value, wherein the first and second percentage values are greater than 10% of the doping of the layer which is arranged nearer to the active zone, wherein adjoining the second layer a further second layer is provided, wherein the second layer and the further second layer are formed in such a way that a piezoelectric field is generated at an interface between the second layer and the further second layer, the piezoelectric field being configured to provide an electrical voltage drop at the interface of the second layer and the further second layer, wherein a further second peak doping region is provided at the interface of the second layer and the further second layer in order to reduce the electrical voltage drop, wherein a doping of the further second peak doping region in a direction away from the active zone rises at least by a first percentage value and then falls by at least a second percentage value, and wherein the first and second percentage values are greater than 10% of the doping of the layer which is arranged nearer to the active zone.

11. The component according to claim 10, wherein the first layer of the first layer arrangement comprises a positive doping which is greater than $5 \times 10^{18}/cm^3$.

12. The component according to claim 10, wherein the doping in the second waveguide outside the second peak doping region is less than or equal to the doping in the second layer.

13. The component according to claim 10, wherein the doping in the second waveguide outside the second peak doping region is less than or equal to the doping in the second layer, wherein the second waveguide layer comprises a negative doping which, at least in a second section, is less than $1 \times 10^{18}/cm^3$, wherein the second section is arranged between the active zone and the second peak doping region, and wherein the second layer of the second layer arrangement comprises a negative doping which is greater than $5 \times 10^{17}/cm^3$.

14. The component according to claim 9, wherein the first layer of the first layer arrangement comprises a positive doping which comprises less than $5 \times 10^{19}/cm^3$.

15. The component according to claim 10, wherein the second waveguide layer of the second layer arrangement comprises a negative doping which comprises less than $5 \times 10^{18}/cm^3$, wherein the second layer comprises a negative doping which is less than $5 \times 10^{18}/cm^3$, wherein the negative doping in the second layer rises at a predefined distance in a direction away from the active zone with respect to the second waveguide layer.

16. The component according to claim 9, wherein outside the first and/or the second peak doping region the positive doping of the first layer is less than or equal to the positive doping of the further first layer.

17. The component according to claim 10, wherein outside the first and/or the second peak doping region the negative doping of the second layer is less than or equal to the negative doping of the further second layer.

18. The component according to any one of claim 9, wherein an additional first layer adjoins the further first layer, wherein in a transition region between the further first layer and the additional first layer the positive doping rises in the direction of the additional first layer, and wherein the additional first layer comprises a smaller band gap than the further first layer.

19. An optoelectronic component comprising:
an active zone for generating electromagnetic radiation, wherein the active zone adjoins at least one layer arrangement composed of a semiconducting material, wherein the layer arrangement comprises at least two layers, wherein the two layers are formed in such a way that a piezoelectric field is generated at an interface between the two layers, the piezoelectric field being configured to provide an electrical voltage drop at the interface, wherein a peak doping region is provided at the interface of the two layers in order to reduce the electrical voltage drop, wherein a doping of the peak doping region in a direction away from the active zone rises at least by a first percentage value and then falls by at least a second percentage value, wherein the first and second percentage values are greater than 10% of a maximum doping of the peak doping region, wherein the active zone comprises at least one quantum well layer arranged between two barrier layers, wherein at least one of the barrier layers is negatively doped, wherein the negative doping is greater than $5 \times 10^{17}/cm^3$, wherein a positive doping in the layers is formed in such a way that for a predefined minimum intensity of an optical wave the doping is below a predefined maximum doping, wherein the minimum intensity is less than 40%, and wherein the maximum doping is less than $2 \times 10^{19}/cm^3$, and/or wherein the negative doping of the layers is formed in such a way that for a predefined minimum intensity of the optical wave the doping is below a predefined maximum doping, wherein the minimum intensity is less than 40%, and wherein the maximum doping is arranged to be less than $1\times10^{18}/cm^3$.

20. A method for producing an optoelectronic component, the method comprising:

providing an active zone for generating electromagnetic radiation; and adjoining at least one layer arrangement to the active zone adjoins, wherein the layer arrangement is composed of a semiconducting material, wherein the layer arrangement is constructed from at least two layers, wherein the two layers are formed in such a way that a piezoelectric field is generated at an interface between the two layers, the piezoelectric field being configured to provide an electrical voltage drop at the interface, wherein a peak doping region is provided at the interface of the two layers in order to reduce the electrical voltage drop, wherein a doping of the peak doping region in a direction away from the active zone rises at least by a first percentage value and then falls by at least a second percentage value, wherein the first and second percentage values are greater than 10% of a maximum doping of the peak doping region, wherein at least one quantum well layer is formed in the active zone, wherein the quantum well layer is arranged between two barrier layers, wherein at least one of the barrier layers is negatively doped, wherein the negative doping is greater than $5\times10^{17}/cm^3$, wherein the semiconducting material constitutes a binary, ternary and/or quaternary III-V or II-VI compound semiconductor material, wherein the semiconducting material is grown in such a way that the material comprises a surface terminated with a group III element or a surface terminated with a group II element, wherein the group III element is an element from the group consisting of Al, In and Ga, wherein the group II element is an element from the group consisting of Zn, Mg and Cd, wherein the two layers are arranged on a p-side relative to the active zone, wherein the two layers are formed in such a way that a transition from a smaller band gap to a larger band gap is formed between the two layers as viewed in a growth direction of the layers, and wherein the peak doping region is positively doped, or wherein the semiconducting material constitutes a binary, ternary and/or quaternary III-V or II-VI compound semiconductor material, wherein the semiconducting material is grown in such a way that the material comprises a surface terminated with a group III element or with a group II element, wherein the group III element is an element from the group consisting of Al, In and Ga, wherein the group II element is an element from the group consisting of Zn, Mg and Cd, wherein the two layers are arranged on a n-side in relation to the active zone, wherein the two layers are formed in such a way that a transition from a larger band gap to a smaller band gap is formed between the two layers as viewed in a growth direction of the layers, and wherein the peak doping region is negatively doped.

* * * * *

UNITED STATES PATENT AND TRADEMARK OFFICE
CERTIFICATE OF CORRECTION

PATENT NO. : 9,818,910 B2
APPLICATION NO. : 15/501110
DATED : November 14, 2017
INVENTOR(S) : Eichler It is certified that error appears in the above-identified patent and that said Letters Patent is hereby corrected as shown below:

In the Claims

In Column 27, Line 63, Claim 11, delete "$5 \times^{18}/cm^3$" and insert --$5 \times 10^{18}/cm^3$--.

Signed and Sealed this
Sixth Day of February, 2018

Joseph Matal
*Performing the Functions and Duties of the*
*Under Secretary of Commerce for Intellectual Property and*
*Director of the United States Patent and Trademark Office*